(12) United States Patent
Tiwari

(10) Patent No.: US 9,928,887 B2
(45) Date of Patent: *Mar. 27, 2018

(54) DATA SHIFT BY ELEMENTS OF A VECTOR IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/457,339

(22) Filed: Mar. 13, 2017

(65) Prior Publication Data
US 2017/0186468 A1 Jun. 29, 2017

Related U.S. Application Data

(63) Continuation of application No. 15/060,222, filed on Mar. 3, 2016, now Pat. No. 9,741,399.
(Continued)

(51) Int. Cl.
G11C 7/10 (2006.01)
G11C 7/06 (2006.01)
(Continued)

(52) U.S. Cl.
CPC .......... *G11C 7/1036* (2013.01); *G11C 7/065* (2013.01); *G11C 7/1006* (2013.01);
(Continued)

(58) Field of Classification Search
CPC .................................................. G11C 7/1006
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Office Action for related Taiwan Patent Application No. 105107657, dated Mar. 3, 2017, 19 pages.
(Continued)

*Primary Examiner* — Son Mai
(74) *Attorney, Agent, or Firm* — Brooks, Cameron & Huebsch, PLLC

(57) ABSTRACT

Examples of the present disclosure provide apparatuses and methods for performing shift operations in a memory. An example method comprises performing a shift operation a first element stored in a first group of memory cells coupled to a first access line and a number of sense lines of a memory array and a second element stored in a second group of memory cells coupled to a second access line and the number of sense lines of the memory array. The method can include shifting the first element by a number of bit positions defined by the second element by performing a number of AND operations, OR operations, SHIFT operations, and INVERT operations performed without transferring data via an input/output (I/O) line.

20 Claims, 17 Drawing Sheets

Related U.S. Application Data

(60) Provisional application No. 62/131,654, filed on Mar. 11, 2015.

(51) Int. Cl.
  *G11C 11/4091* (2006.01)
  *G11C 11/4096* (2006.01)

(52) U.S. Cl.
  CPC ........ *G11C 7/1012* (2013.01); *G11C 11/4091* (2013.01); *G11C 11/4096* (2013.01)

(58) Field of Classification Search
  USPC .................................................. 365/189.17
  See application file for complete search history.

(56) References Cited

U.S. PATENT DOCUMENTS

| | | |
|---|---|---|
| 4,435,793 A | 3/1984 | Ochil |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,222,047 A * | 6/1993 | Matsuda ............ G11C 7/1036 365/230.03 |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,457,188 B2 | 11/2008 | Lee |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,586,793 B2 | 9/2009 | Cernea |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |

(56) References Cited

U.S. PATENT DOCUMENTS

| | | |
|---|---|---|
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,019,785 B2 | 4/2015 | Cowles et al. |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Penner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0089166 A1 | 3/2015 | Kogge |
| 2015/0134713 A1 | 5/2015 | Wheeler |
| 2015/0324290 A1 | 11/2015 | Leidel |
| 2015/0325272 A1 | 11/2015 | Murphy |
| 2016/0148692 A1* | 5/2016 | Chen .................. G11C 16/10 711/103 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |

(56) References Cited

FOREIGN PATENT DOCUMENTS

| TW | 201346724 | 11/2013 |
|---|---|---|
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Warren Jr., Henry S., "Hacker's Delight", Second Edition, Oct. 2013, pp. 181-184 and 194.

International Search Report and Written Opinion for related PCT Application No. PCT/US2016/021359, dated Jun. 29, 2016, 12 pages.

\* cited by examiner

| | COMP_COMP (431) | EFFECTIVE MASK (433) | ELEMENT MASK (435) | SHIFT MASK (437) | TMPSHIFTED MASK (439) | RESULT (441) | SRCA (443) | SRCB (445) |
|---|---|---|---|---|---|---|---|---|
| 496-1 | | | | | | | 0X04050609 | 0X03020201 |
| 496-2 | 0X01010101 | | | | | | 0X04050609 | 0X03020201 |
| 496-3 | 0X01010101 | 0X01010101 | | | | | 0X04050609 | 0X03020201 |
| 496-4 | 0X80808080 | 0X01010101 | | | | | 0X04050609 | 0X03020201 |
| 496-5 | 0X80808080 | 0X01010101 | 0X80808080 | | | | 0X04050609 | 0X03020201 |
| 496-6.a | 0X03020201 | 0X01010101 | 0X80808080 | | | | 0X04050609 | 0X03020201 |
| 496-6.b | 0X01000001 | 0X01010101 | 0X80808080 | | | | 0X04050609 | 0X03020201 |
| 496-6.c | 0X01000001 | 0X01010101 | 0X80808080 | 0X01000001 | | | 0X04050609 | 0X03020201 |
| 496-6.d.4 | 0X7F00007F | 0X01010101 | 0X80808080 | 0X7F00007F | | | 0X04050609 | 0X03020201 |
| 496-6.e.4 | 0X7F00007F | 0X01010101 | 0X80808080 | 0X7F00007F | | | 0X04050609 | 0X03020201 |
| 496-6.f | 0X04050609 | 0X01010101 | 0X80808080 | 0X7F00007F | | 0X04050609 | 0X04050609 | 0X03020201 |
| 496-6.g | 0X04050609 | 0X01010101 | 0X80808080 | 0X7F00007F | | 0X04050609 | 0X04050609 | 0X03020201 |
| 496-6.h | 0X080A0C12 | 0X01010101 | 0X80808080 | 0X7F00007F | | 0X04050609 | 0X04050609 | 0X03020201 |
| 496-6.i | 0X08000012 | 0X01010101 | 0X80808080 | 0X7F00007F | | 0X04050609 | 0X04050609 | 0X03020201 |
| 496-6.j | 0X08000012 | 0X01010101 | 0X80808080 | 0X7F00007F | | 0X04050609 | 0X04050609 | 0X03020201 |
| 496-6.k | 0X08000012 | 0X01010101 | 0X80808080 | 0X7F00007F | 0X08000012 | 0X04050609 | 0X04050609 | 0X03020201 |
| 496-6.l | 0X80FFFF80 | 0X01010101 | 0X80808080 | 0X7F00007F | 0X08000012 | 0X04050609 | 0X04050609 | 0X03020201 |
| 496-6.m | 0X00050600 | 0X01010101 | 0X80808080 | 0X7F00007F | 0X08000012 | 0X04050609 | 0X04050609 | 0X03020201 |
| 496-6.n | 0X08050612 | 0X01010101 | 0X80808080 | 0X7F00007F | 0X08000012 | 0X04050609 | 0X04050609 | 0X03020201 |
| 496-6.o | 0X08050612 | 0X01010101 | 0X80808080 | 0X7F00007F | 0X08000012 | 0X08050612 | 0X04050609 | 0X03020201 |
| 496-6.p-r | 0X02020202 | 0X02020202 | 0X80808080 | 0X7F00007F | 0X08000012 | 0X08050612 | 0X04050609 | 0X03020201 |

*Fig. 4A*

| | COMP_COMP | EFFECTIVE MASK | ELEMENT MASK | SHIFT MASK | TMPSHIFTED MASK | RESULT | SRCA | SRCB |
|---|---|---|---|---|---|---|---|---|
| 496-6.a | 0X03020201 | 0X02020202 | 0X80808080 | 0X7F00007F | 0X08000012 | 0X08050612 | 0X04050609 | 0X03020201 |
| 496-6.b | 0X02020200 | 0X02020202 | 0X80808080 | 0X7F00007F | 0X08000012 | 0X08050612 | 0X04050609 | 0X03020201 |
| 496-6.c | 0X02020200 | 0X02020202 | 0X80808080 | 0X02020200 | 0X08000012 | 0X08050612 | 0X04050609 | 0X03020201 |
| 496-6.d.4 | 0X7E7E7E00 | 0X02020202 | 0X80808080 | 0X7E7E7E00 | 0X08000012 | 0X08050612 | 0X04050609 | 0X03020201 |
| 496-6.e.4 | 0X7F7F7F00 | 0X02020202 | 0X80808080 | 0X7F7F7F00 | 0X08000012 | 0X08050612 | 0X04050609 | 0X03020201 |
| 496-6.f | 0X08050612 | 0X02020202 | 0X80808080 | 0X7F7F7F00 | 0X08000012 | 0X08050612 | 0X04050609 | 0X03020201 |
| 496-6.g | 0X08050612 | 0X02020202 | 0X80808080 | 0X7F7F7F00 | 0X08000012 | 0X08050612 | 0X04050609 | 0X03020201 |
| 496-6.h | 0X20141848 | 0X02020202 | 0X80808080 | 0X7F7F7F00 | 0X08000012 | 0X08050612 | 0X04050609 | 0X03020201 |
| 496-6.i | 0X20141800 | 0X02020202 | 0X80808080 | 0X7F7F7F00 | 0X08000012 | 0X08050612 | 0X04050609 | 0X03020201 |
| 496-6.j | 0X20141800 | 0X02020202 | 0X80808080 | 0X7F7F7F00 | 0X20141800 | 0X08050612 | 0X04050609 | 0X03020201 |
| 496-6.k | 0X20141800 | 0X02020202 | 0X80808080 | 0X7F7F7F00 | 0X20141800 | 0X08050612 | 0X04050609 | 0X03020201 |
| 496-6.l | 0X808080FF | 0X02020202 | 0X80808080 | 0X7F7F7F00 | 0X20141800 | 0X08050612 | 0X04050609 | 0X03020201 |
| 496-6.m | 0X00000012 | 0X02020202 | 0X80808080 | 0X7F7F7F00 | 0X20141800 | 0X08050612 | 0X04050609 | 0X03020201 |
| 496-6.n | 0X20141812 | 0X02020202 | 0X80808080 | 0X7F7F7F00 | 0X20141800 | 0X08050612 | 0X04050609 | 0X03020201 |
| 496-6.o | 0X20141812 | 0X02020202 | 0X80808080 | 0X7F7F7F00 | 0X20141800 | 0X20141812 | 0X04050609 | 0X03020201 |
| 496-6.p-r | 0X04040404 | 0X04040404 | 0X80808080 | 0X7F7F7F00 | 0X20141800 | 0X20141812 | 0X04050609 | 0X03020201 |

*Fig. 4B*

| | COMP_COMP 431 | EFFECTIVE MASK 433 | ELEMENT MASK 435 | SHIFT MASK 437 | TMPSHIFTED MASK 439 | RESULT 441 | SRCA 443 | SRCB 445 |
|---|---|---|---|---|---|---|---|---|
| 496-6.a | 0X03020201 | 0X04040404 | 0X80808080 | 0X7F7F7F00 | 0X20141800 | 0X20141812 | 0X04050609 | 0X03020201 |
| 496-6.b | 0X00000000 | 0X04040404 | 0X80808080 | 0X7F7F7F00 | 0X20141800 | 0X20141812 | 0X04050609 | 0X03020201 |
| 496-6.c | 0X00000000 | 0X04040404 | 0X80808080 | 0X00000000 | 0X20141800 | 0X20141812 | 0X04050609 | 0X03020201 |
| 496-6.d.4 | 0X00000000 | 0X04040404 | 0X80808080 | 0X00000000 | 0X20141800 | 0X20141812 | 0X04050609 | 0X03020201 |
| 496-6.e.4 | 0X00000000 | 0X04040404 | 0X80808080 | 0X00000000 | 0X20141800 | 0X20141812 | 0X04050609 | 0X03020201 |
| 496-6.f | 0X20141812 | 0X04040404 | 0X80808080 | 0X00000000 | 0X20141800 | 0X20141812 | 0X04050609 | 0X03020201 |
| 496-6.g | 0X20141812 | 0X04040404 | 0X80808080 | 0X00000000 | 0X20141800 | 0X20141812 | 0X04050609 | 0X03020201 |
| 496-6.h | 0X01418120 | 0X04040404 | 0X80808080 | 0X00000000 | 0X20141800 | 0X20141812 | 0X04050609 | 0X03020201 |
| 496-6.i | 0X00000000 | 0X04040404 | 0X80808080 | 0X00000000 | 0X20141800 | 0X20141812 | 0X04050609 | 0X03020201 |
| 496-6.j | 0X00000000 | 0X04040404 | 0X80808080 | 0X00000000 | 0X00000000 | 0X20141812 | 0X04050609 | 0X03020201 |
| 496-6.k | 0X00000000 | 0X04040404 | 0X80808080 | 0X00000000 | 0X00000000 | 0X20141812 | 0X04050609 | 0X03020201 |
| 496-6.l | 0XFFFFFFFF | 0X04040404 | 0X80808080 | 0X00000000 | 0X00000000 | 0X20141812 | 0X04050609 | 0X03020201 |
| 496-6.m | 0X20141812 | 0X04040404 | 0X80808080 | 0X00000000 | 0X00000000 | 0X20141812 | 0X04050609 | 0X03020201 |
| 496-6.n | 0X20141812 | 0X04040404 | 0X80808080 | 0X00000000 | 0X00000000 | 0X20141812 | 0X04050609 | 0X03020201 |
| 496-6.o | 0X20141812 | 0X04040404 | 0X80808080 | 0X00000000 | 0X00000000 | 0X20141812 | 0X04050609 | 0X03020201 |
| 496-6.p-r | 0X08080808 | 0X08080808 | 0X80808080 | 0X00000000 | 0X00000000 | 0X20141812 | 0X04050609 | 0X03020201 |

*Fig. 4C*

TABLE 8-1

| | 844 | 845 | 856 | 870 | 871 |
|---|---|---|---|---|---|
| | A | B | NOT OPEN | OPEN TRUE | OPEN INVERT |
| | 0 | 0 | 0 | 0 | 1 |
| | 0 | 1 | 0 | 1 | 0 |
| 875 → | | | | | |
| | 1 | 0 | 1 | 0 | 1 |
| | 1 | 1 | 1 | 1 | 0 |

TABLE 8-2

| | | | | | | | | | | | |
|---|---|---|---|---|---|---|---|---|---|---|---|
| | FF | 0 | 0 | 0 | 0 | 0 | 0 | 1 | 1 | 1 | ← 876 |
| | FT | 0 | 0 | 0 | 1 | 1 | 1 | 0 | 0 | 0 | ← 877 |
| | TF | 0 | 0 | 1 | 0 | 0 | 1 | 0 | 0 | 1 | ← 878 |
| | TT | 0 | 1 | 0 | 0 | 1 | 0 | 0 | 1 | 0 | ← 879 |
| A | B | A | A*B | A*$\bar{B}$ | A+B | B | AXB | A+$\bar{B}$ | $\overline{AXB}$ | $\bar{B}$ | ← 847 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

(876, 877, 878, 879 grouped as 880)

*Fig. 8*

DATA SHIFT BY ELEMENTS OF A VECTOR IN MEMORY

PRIORITY INFORMATION

This application is Continuation of U.S. application Ser. No. 15/060,222, filed Mar. 3, 2016, which issues as U.S. Pat. No. 9,601,166 on Mar. 21, 2017, which claims benefit of priority under 35 U.S.C. 119(e) to U.S. Provisional Application Ser. No. Application No. 62/131,654, filed Mar. 11, 2015, the contents of which are included herein by reference.

TECHNICAL FIELD

The present disclosure relates generally to semiconductor memory apparatuses and methods, and more particularly, to apparatuses and methods related to performing shift operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIG. 4A-4C illustrate tables showing the states of memory cells of an array at a particular phase associated with performing a shift operation in accordance with a number of embodiments of the present disclosure.

FIG. 8 is a logic table illustrating selectable logic operation results implemented by a sensing circuitry in accordance with a number of embodiments of the present disclosure.

DETAILED DESCRIPTION

Figure 1:
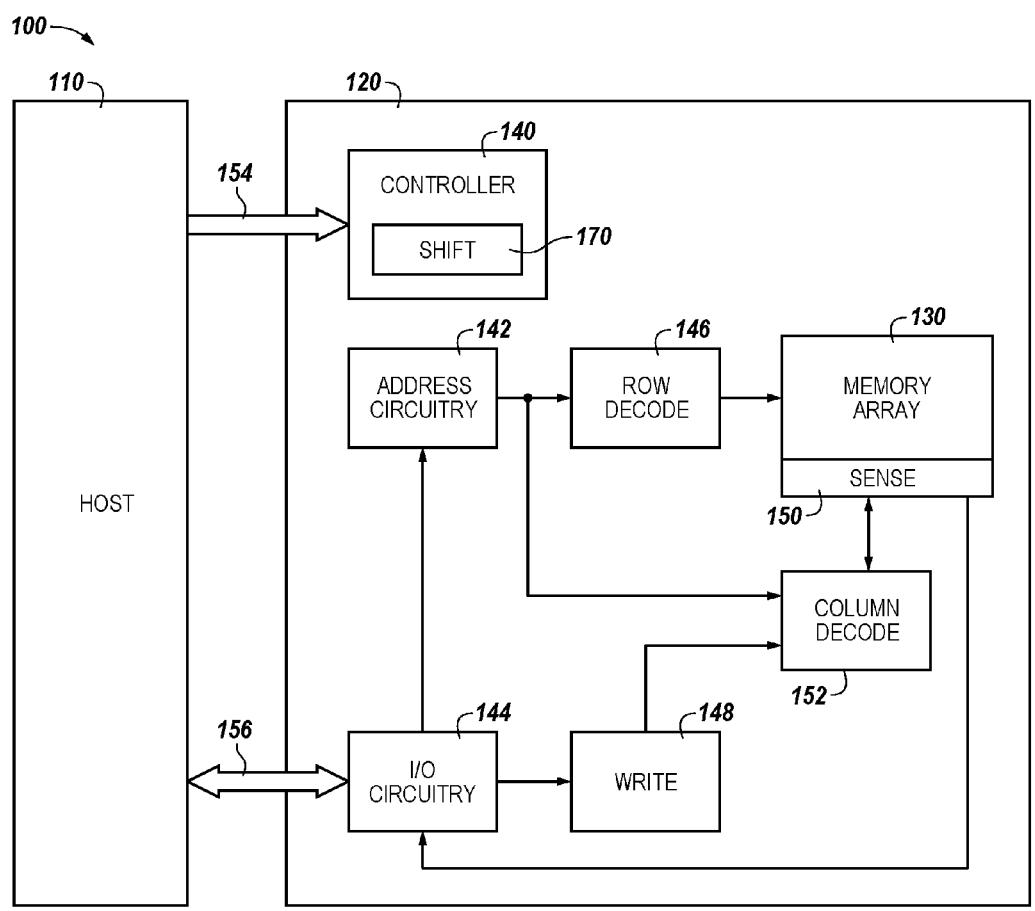
FIG. 1 is a block diagram of an apparatus in the form of a computing system including a memory device in accordance with a number of embodiments of the present disclosure.

The present disclosure includes apparatuses and methods related to performing shift operations for memory. A shift operation can be performed by shifting a first number of bit-vectors by a number of bit positions defined by a second number of bit-vectors. For example, a first element defined by a first bit-vector can be shifted a number of bit positions defined by a second element that is defined by a second bit-vector. The first vector can be stored in a group of memory cells coupled to a first access line and a number of sense lines of a memory array. The second vector can be stored in a group of memory cells coupled to a second access line and the number of sense lines of the memory array. The shift operation can include a number of AND operations, OR operations, SHIFT operations, and INVERT operations performed without transferring data via an input/output (I/O) line.

As used herein, a first element and a second element can be numerical values. A first element can be stored in a first bit-vector. The bit-vector can be a binary representation of an element and/or a plurality of elements. Shifting a first element can include shifting a bit-vector representation of the first element within memory cells that store the bit-vector. The bit-vector can be shifted a number of bit positions within memory cells that store the bit-vector. A number of bit-positions by which a bit-vector is shifted can be defined by a different bit-vector.

The bit-vector can be shifted within the memory cells when the different bit-vector has at least one element that has a decimal value of one or higher. For example, a first element within a first bit-vector can be shifted within a first number of memory cells when a third element in a second bit-vector has a decimal value of one or higher and a second element within a second bit-vector can be shifted within a second number of memory cells when a fourth element in a second bit-vector has a decimal value of one or higher.

In a number of examples, a first bit-vector representing a number of elements can be shifted by shifting each of a number of portions of the first bit-vector an associated number of bit positions defined by a second bit-vector. For example, a first portion of a first bit-vector that defines a first element can be shifted a first number of bit positions within a first portion of a number of memory cells and a second portion of the first bit-vector that defines a second element can be shifted a second number of bit positions within a second portion of the number of memory cells. The first number of bit positions can be defined by a first portion of a second bit-vector that defines a third element and the second number of bit positions can be defined by a second portion of a second bit-vector that defines a fourth element.

In a number of examples, an element can represent an object and/or other construct, which may be stored in memory as a bit-vector. As an example, a shift operation can be performed to shift bit-vectors that represent a first number of objects by a number of bit positions defined by bit-vectors that represent a second number of objects.

A number of embodiments of the present disclosure can provide a reduction of the number of computations and/or time involved in performing a number of shift operations (e.g., shift functions) relative to previous approaches. For instance, the number of computations and/or the time can be reduced due to an ability to perform various portions of the number of shift operations in parallel (e.g., simultaneously). Performing a number of shift operations as described herein can also reduce power consumption as compared to previous approaches. In accordance with a number of embodiments, a shift operation can be performed on elements (e.g., data in the form of bit-vectors stored in an array) without transferring data out of the memory array and/or sensing circuitry via a bus (e.g., data bus, address bus, control bus, etc.). A shift operation can involve performing a number of operations (e.g., AND operations, OR operations, SHIFT operations, INVERT operations, and Block_OR operations, etc.). However, embodiments are not limited to these examples.

In various previous approaches, elements (e.g., a first value) to be shifted may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single shift operation can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU). For example, moving the data from the memory array to the processing resource can include performing a sense line address access (e.g., firing of a column decode signal) in order to transfer data from sense lines onto I/O lines, moving the data to the array periphery, and providing the data to a register in association with performing a shift operation, for instance. Further, shifting elements in parallel can be difficult and consume power and time.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller. The controller 140 can include a shift controller 170 that can control signals provided to, for instance, shift circuitry (e.g., shift circuitry 223 described in connection with FIG. 2) in association with performing data shifting as described further herein. For example, data in an array (e.g., array 130) can be shifted (e.g., right or left) via (e.g., through) the shift circuitry during a reduction or prefix sum operation, as will be further described herein.

An example of the sensing circuitry 150 is described further below in association with FIGS. 2A and 2B. For instance, in a number of embodiments, the sensing circuitry 150 can comprise a number of sense amplifiers and a number of compute components, which may comprise latch serving as an accumulator and can be used to perform logical operations (e.g., on data associated with complementary sense lines). In a number of embodiments, the sensing circuitry (e.g., 150) can be used to perform shift operations using data stored in array 130 as inputs and store the results of the shift operations back to the array 130 without transferring via a sense line address access (e.g., without firing a column decode signal). As such, a shift operation can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on control circuitry 140 or elsewhere)).

In various previous approaches, data associated with a shift operation, for instance, would be read from memory via sensing circuitry and provided to an external ALU. The external ALU circuitry would perform the shift operations using the elements (which may be referred to as operands or inputs) and the result could be transferred back to the array via the local I/O lines. In contrast, in a number of embodiments of the present disclosure, sensing circuitry (e.g., 150) is configured to perform a shift operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the shift operation as the sensing circuitry 150 can be operated to perform the appropriate computations involved in performing the shift operation using the address space of memory array 130. Additionally, the shift operation can be performed without the use of an external processing resource.

Figure 2A:
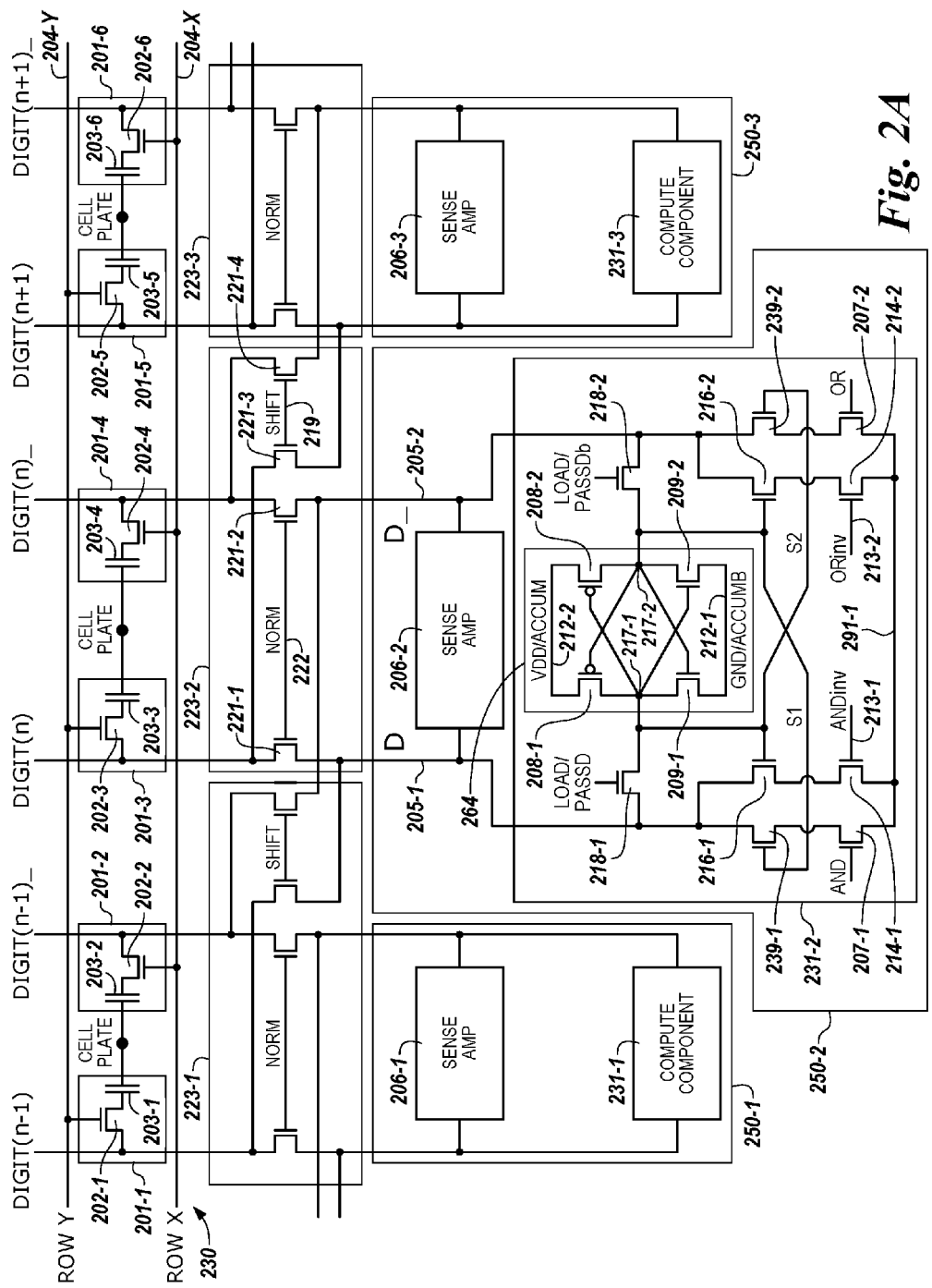
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell (e.g., one of memory cells 201-1, 201-2, 201-3, 201-4, 201-5, 201-6) comprises a storage element (e.g., one of corresponding capacitors 203-1 to 203-6) and an access device (e.g., one of corresponding transistors 202-1 to 202-6). For instance, memory cell 201-3 comprises transistor 202-3 and capacitor 203-3 memory cell 201-4 comprises transistor 202-4 and capacitor 203-4, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-4 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional number of (e.g., ten) transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch 264 of the compute component 231-2 can be collectively referred to herein as a secondary latch, which can serve as an accumulator. As such, the compute component 231-2 can operate as and/or be referred to herein as an accumulator. The compute component 231-2 can be coupled to each of the data lines D 205-1 and D_ 205-2 as shown in FIG. 2A. The transistors of compute component 231-2 can all be n-channel transistors (e.g., NMOS transistors), for example. However, embodiments are not limited to this example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND) 291-1). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating a LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each have a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors. As used herein, configuration is intended to mean size, doping level, and transition type.

Load transistors can be configured (e.g., can be sized, doped, etc.) to handle loading specifications associated with coupling data lines to the local dynamic nodes S1 and S2, for example. Pass transistors, however, can be configured to handle heavier loading associated with coupling data lines to an adjacent accumulator (e.g., through the adjacent compute component 231-3 and shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. For example, load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch. For example, the gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2. As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
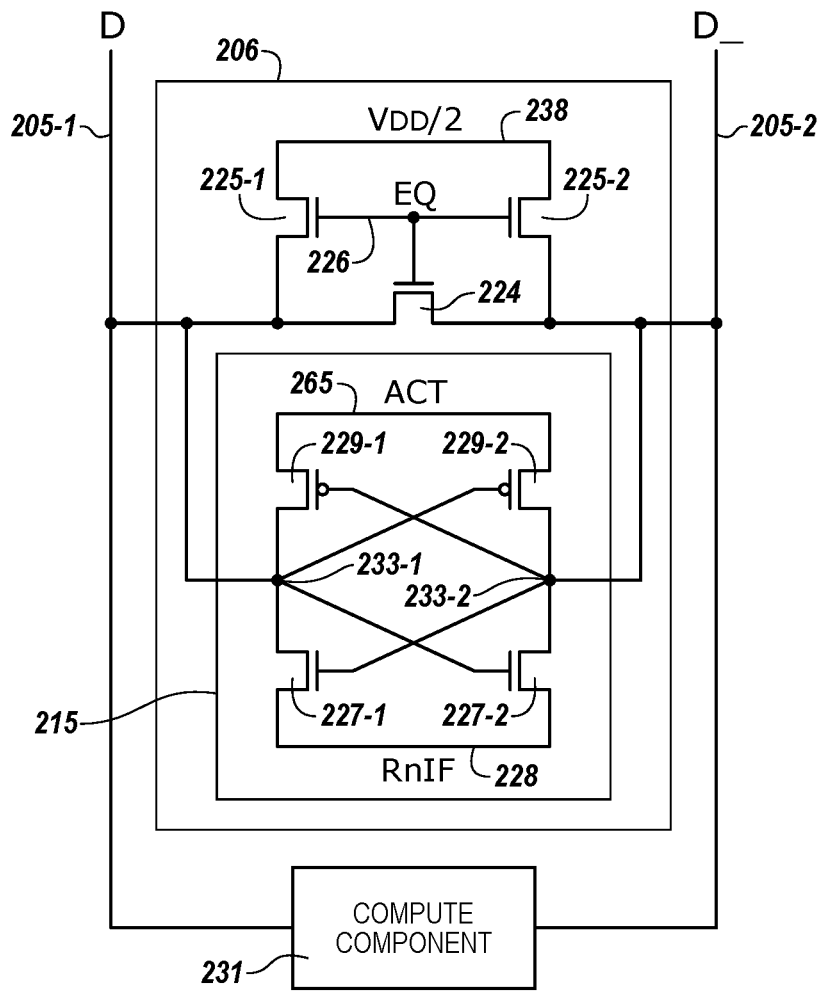
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In some examples, sensing circuitry 250-2 can include shifting can include shifting circuitry 223-2 and/or sensing circuitry 223-1. In this example, the shift circuitry 223-2 comprises a pair of isolation devices (e.g., isolation transistors 221-1 and 221-2) coupled to data lines 205-1 (D) and 205-2 (D_), respectively. The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be arranged as a portion of (e.g., within) the sense amplifier 206-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n)_ shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n)_ to the left and DIGIT(n+2) and DIGIT(n+2)_ to the right (not shown)).

Embodiments of the present disclosure are not limited to the configuration of shift circuitry 223-2 shown in FIG. 2A. For example, determining whether to shift in a particular direction to perform a shift operation is independent of the circuitry implementation. In a number of embodiments, shift circuitry 223-2 such as that shown in FIG. 2A can be operated (e.g., in conjunction with sense amplifiers 206-2 and compute components 231-2) in association with performing mathematical operations such as adding and subtracting operations without transferring data out of the sensing circuitry 250-2 via an I/O line (e.g., local I/O line (IO/IO_)), for instance.

Although not shown in FIG. 2A, each column of memory cells can be coupled to a column decode line that can be activated to transfer, via local I/O line (e.g., I/O line 334 in FIG. 3), a data value from a corresponding sense amplifier 206-2 and/or compute component 231-2 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform logical operations without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206-2) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). Sense amplifier 206-2 comprises a latch 215 including four transistors coupled to a pair of complementary data lines D 205-1 and D_ 205-2. The latch 215 can be a cross coupled latch. For example, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206-2 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206-2 and compute component 231-2, and the result can be stored in the sense amplifier and/or compute component.

The sensing circuitry 250-2 (e.g., 250-2 in FIG. 2A) can be operated in several modes to perform logical operations, including a first mode in which a result of the logical operation is initially stored in the sense amplifier 206-2, and a second mode in which a result of the logical operation is initially stored in the compute component 231-2. Additionally with respect to the first operating mode, sensing circuitry 250-2 can be operated in both pre-sensing (e.g., sense amps fired before logical operation control signal active) and post-sensing (e.g., sense amps fired after logical operation control signal active) modes with a result of a logical operation being initially stored in the sense amplifier 206-2.

As described further below, the sense amplifier 206-2 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
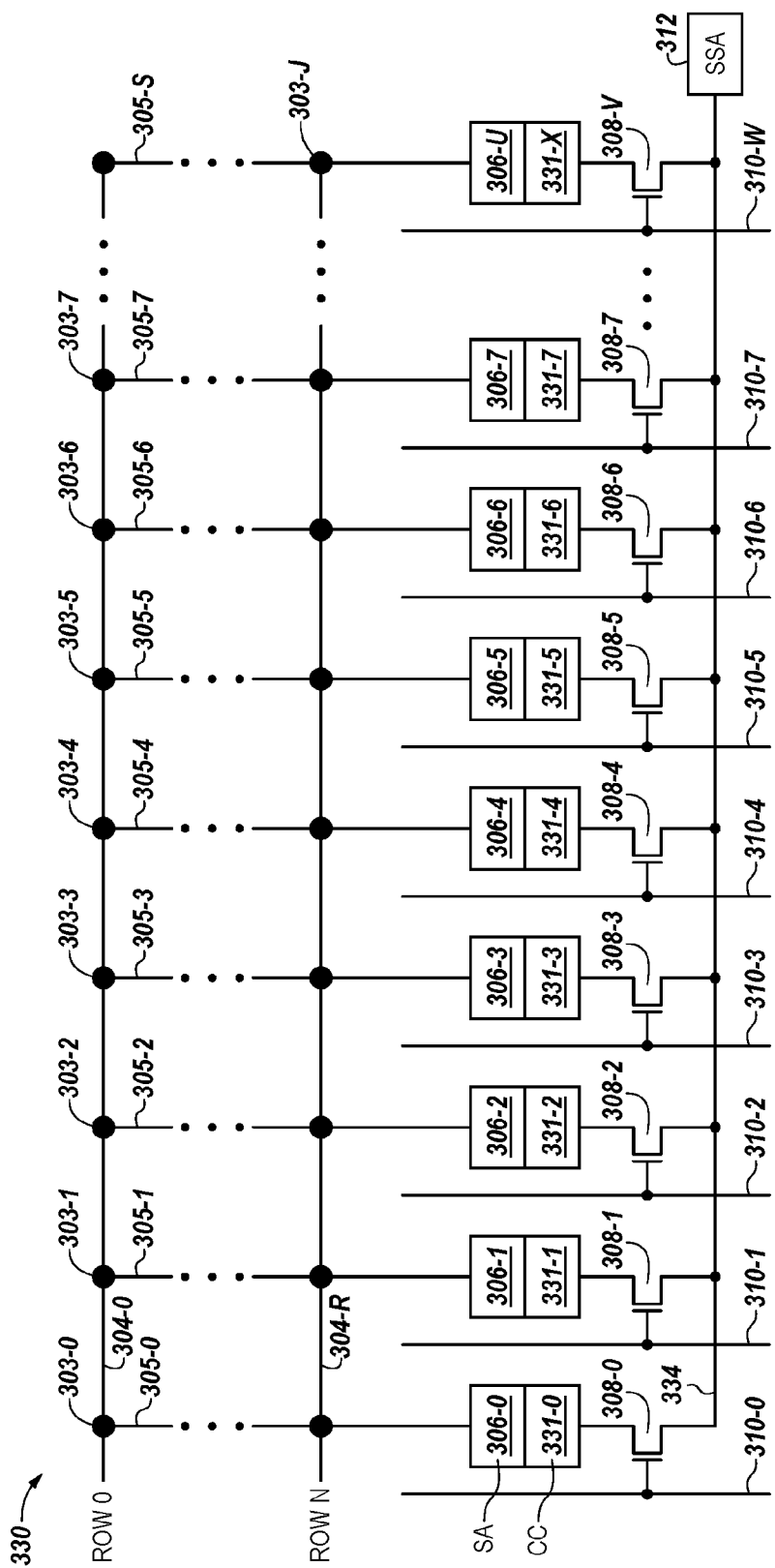
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells (referred to generally as memory cells 303, and more specifically as 303-0 to 303-J) coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X coupled to the respective sense lines. Column decode lines 310-1 to 310-W are coupled to the gates of transistors 308-1 to 308-V, respectively, and can be selectively activated to transfer data sensed by respective sense amps 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

In a number of embodiments, the sensing circuitry (e.g., compute components 331 and sense amplifiers 306) is configured to perform a shift operation on elements stored in array 330. As an example, a first plurality elements can be stored in a first group of memory cells coupled to a particular access line (e.g., 304-0) and to a number of sense lines (e.g., 305-0 to 305-S), and a second plurality of elements can be stored in a second group of memory cells coupled to a different access line (e.g., 304-1) and the respective number of sense lines (305-0 to 305-S). Each element of the first plurality of elements can be shifted a number of bit positions defined by a respective one of the second plurality of elements, and the result of the shift operation can be stored (e.g., as a bit-vector(s)) in a third group of memory cells coupled to a particular access line (e.g., 304-0 to 304-R) and to the number of sense lines (e.g., 305-0 to 305-S). The third group of memory cells can, for example, be coupled to an access line 304-R or to at least one of access lines 304-0 to 304-R. For example, the third group of memory cells can be a same group of memory cells as the first group of memory cells or the second group of memory cells (e.g., a result of a shift operation can be written over a currently stored element).

An example shift operation is described below in association with FIG. 4A-4C, which illustrates tables showing the states of memory cells of an array (e.g., 330) at a number of particular phases associated with performing the shift operation in accordance with a number of embodiments described herein. The reference numbers of the column 496 in FIGS. 4A-4C correspond to respective reference numbers of the pseudo code described below. Each row of the tables indicates the values of a number of bit vectors 431 (COMP_COMP), 433 (EFFECTIVE MASK), 435 (ELEMENT MASK), 437 (SHIFT MASK), 439 (TMPSHIFTED MASK), 441 (RESULT), 443 (SRCA), and 445 (SRCB) at a particular phase of the shift operation as can be stored in rows and/or columns of memory cells in the array (e.g., 330 in FIG. 3).

The example shown in FIG. 4A-4C is associated with shifting a first four elements stored in memory cells coupled to access line 304-0 and to sense lines 305-0 to 305-31 by a respective second four elements stored in memory cells coupled to access line 304-1 and to sense lines 305-0 to 305-31. In the example below, the first four elements are represented by SRCA 443 (e.g., [0000 0100, 0000 0101, 0000 0110, 0000 1001] (wherein commas can separate different elements), which can be represented in hexadecimal notation as [0x04, 05, 06, 09] (where the "0x" notation indicates hexadecimal and commas can separate different elements) and is shown in FIG. 4A-4C as "0x04050609"). The second four elements are represented by SRCB 445 (e.g., [0000 0011, 0000 0010, 0000 0010, 0000 0001], which can be represented in hexadecimal notation as [0x03, 02, 02, 01] and is shown in FIGS. 4A-4C as "0x03020201"). The expected result of shifting SRCA 443 by a number of bit positions defined in SRCB 445 is RESULT 441 [0x20141812].

In this example, SRCA 443 and SRCB 445 have a length of 32 bits and the "ith" element of SRCA 443 is shifted by a number of bit positions defined by the "ith" element of SRCA 445 (e.g., the first element of SRCA 443 is shifted a number of bit positions defined by the first element of SRCB 445, the second element of SRCA 443 is shifted a number of bit positions defined by the second element of SRCB 445, etc.), such that four shift operations are performed in parallel using four element pairs. In this example, each of the four elements represented by each of SRCA 443 and SRCB 445 has a same vector length of eight bits. For instance, the first, second, third, and fourth elements of SRCA 443 and the first, second, third, and fourth elements of SRCB 445 are represented by 8-bit vectors. It is noted that although hexadecimal notation is used in FIGS. 4A-4C, the bit-vectors are stored as binary data patterns in the array during the shift operation. Also, in the examples described herein, commas and/or spaces may be used to separate individual elements within a bit-vector. For instance, in the example above, the bit-vectors 443 and 445 each comprise four elements which can be separated by spaces. Embodiments are not limited to a particular element size (e.g., to a particular number of elements and/or bits per element). The result of the shift operation can be stored in array (e.g., 330) in which the vectors comprising the elements being shifted are stored, and/or can be transferred external to the array (e.g., to functional unit circuitry of a host).

The expected result of performing a shift operation using SRCA 443 (e.g., [0x04050609] in hexadecimal) and SRCB 445 (e.g., [0x03020201] in hexadecimal) is bit-vector [0x20141812] (e.g., 441). As described further below, the result of a shift operation can be stored as a bit-vector in a particular group of memory cells. For instance, in the example of FIGS. 4A-4C, the memory cells corresponding to RESULT 441 are used to store the result of the shift operation. As such, at the conclusion of the example described in FIGS. 4A-4C, the value of RESULT 441 [0x20141812] in hexadecimal (e.g., binary [0010 0000, 0001 0100, 0001 1000, 0001 0010]), which represents the four results of four different shift operations.

As described further below, the bit vectors 433 (EFFECTIVE MASK), 435 (ELEMENT MASK), 437 (SHIFT MASK), and 439 (TMPSHIFT MASK) can be used in association with performing a shift operation. The bit-vectors 433, 435, 437, and 439 can be stored in respective groups of memory cells coupled to particular access lines, which may be referred to as temporary storage rows. As used herein, temporary storage rows of memory cells are storing data that may be updated during various phases of a shift operation). As an example, the bit-vectors 433, 435, 437, and 439 can have a same length as RESULT 441, SRCA 443, and SRCAB 445 and can be stored in cells coupled to the same sense lines as SRCA 443 and SRCAB 445. For instance, the bit-vector 433 (EFFECTIVE MASK) can have a length of 32 bits and can be stored in a group of cells coupled to access line 304-2 (not shown) and to sense lines 305-0 to 305-31, the bit-vector 435 (ELEMENT MASK) can have a length of 32 bits and can be stored in a group of cells coupled to access line 304-3 (not shown) and to sense lines 305-0 to 305-31, the bit-vector 437 (SHIFT MASK) can have a length of 32 bits and can be stored in a group of cells coupled to access line 304-4 (not shown) and to sense lines 305-0 to 305-31, and the bit-vector 439 (TMPSHIFT MASK) can have a length of 32 bits and can be stored in a group of cells coupled to access line 304-5 (not shown) and to sense lines 305-0 to 305-31. The bit-vector 431 (COMP_COMP) represents the data stored in the sensing circuitry (e.g., compute components 331 and/or sense amplifiers 306) corresponding to the sense lines having cells coupled thereto which store elements being shifted (e.g., sense lines 305-0 to 305-31 in this example).

In the example described in association with FIGS. 4A-4C, the first element of the SRCA 443 (e.g., hexadecimal value "04" in the most significant element position) can be stored (e.g., as an eight bit bit-vector [0000 0100]) in memory cells 303-0 to 303-7, and the first element of the SRCB 445 (e.g., hexadecimal value "03" in the most significant element position) can be stored (e.g., as an eight bit bit-vector [0000 0011]) in memory cells coupled to access line 304-1 (e.g., ROW 1, not shown) and sense lines 305-0 to 305-7. As an example, the most significant bits (MSBs) of the respective bit-vectors (e.g., [0000 0100] and [0000 0011]) can be stored in cells coupled to sense line 305-0, the next MSBs of the respective bit-vectors can be stored in cells coupled to sense line 305-1, . . . , and the least significant bits (LSBs) of the respective bit-vectors can be stored in cells coupled to sense line 305-7. As used herein, the left most bit of a bit-vector is considered the MSB; however, embodiments are not so limited.

The second element of the SRCA 443 (e.g., hexadecimal value "05" in the second most significant element position) can be stored (e.g., as an eight bit bit-vector [0000 0101]) in memory cells 303-8 to 303-15, and the second element of the SRCB 445 (e.g., hexadecimal value "02" in the second most significant element position) can be stored (e.g., as an eight bit bit-vector [0000 0010]) in memory cells coupled to access line 304-1 (e.g., ROW 1, not shown) and sense lines 305-8 to 305-15. The third element of the SRCA 443 (e.g., hexadecimal value "06" in the third most significant element position) can be stored (e.g., as an eight bit bit-vector [0000 0110]) in memory cells 303-16 to 303-23, and the third element of the SRCB 445 (e.g., hexadecimal value "02" in the third most significant element position) can be stored (e.g., as an eight bit bit-vector [0000 0010]) in memory cells coupled to access line 304-1 (e.g., ROW 1, not shown) and sense lines 305-16 to 305-23. The fourth element of the SRCA 443 (e.g., hexadecimal value "09" in the least significant element position) can be stored (e.g., as an eight bit bit-vector [0000 1001]) in memory cells 303-34 to 303-31, and the fourth element of the SRCB 445 (e.g., hexadecimal value "01" in the least significant element position) can be stored (e.g., as an eight bit bit-vector [0000 0001]) in memory cells coupled to access line 304-1 (e.g., ROW 1, not shown) and sense lines 305-24 to 305-31.

In a number of examples, a shift operation includes performing a number of AND operations, OR operations, SHIFT operations, INVERT operations, and BlockOR operations. The shift operation includes performing the AND operations, OR operations, SHIFT operations, and INVERT operations without transferring data via an input/output (I/O) line to shift a first element by a number of bit positions defined by a second element. The number of AND operations, OR operations, INVERT operations, and SHIFT operations can be performed using sensing circuitry on pitch with the memory array and with each of a number of columns of complementary sense lines.

The below pseudo code represents instructions executable to perform a number of shift operations in a memory in accordance with a number of embodiments of the present disclosure. The example pseudo code is referenced using reference numbers 1-6, which correspond to the reference numbers 1-6 shown in column 469 of the table shown in FIGS. 4A-4C. For instance, reference number one (1) corresponds to "row_to_row(srca, result)" in the pseudocode, and reference number two (2) correspond to "pgen_impl(1, ELEMENT_WIDTH)" in the pseudocode.

```
1.      row_to_row(SRCA, RESULT);
2.      pgen_impl(1, ELEMENT_WIDTH);
3.      acc_to_row(EFFECTIVE MASK);
4.      shift_accip(LEFT, ZERO, ELEMENT_WIDTH – 1);
5.      acc_to_row(ELEMENT MASK);
6.      for (len_t c = 0; c < max_steps; c++) {
6.a         row_to_acc(SRCB);
6.b         row_AND_accip(EFFECTIVE MASK);
6.c         acc_to_row(SHIFT MASK);
6.d         for (len_t e = 0; e < ELEMENT_WIDTH – c – 1; e++) {
6.d.1           shift_accip(LEFT, ZERO, 1);
6.d.2           row_OR_accip(SHIFT MASK);
6.d.3           row_inv_AND_accip(ELEMENT MASK);
6.d.4           acc_to_row(SHIFT MASK);
            }
6.e         for (len_t e = 0; e < c; e++) {
6.e.1           shift_accip(RIGHT, ZERO, 1);
6.e.2           (SHIFT MASK);
6.e.3           row_inv_AND_accip(ELEMENT MASK);
6.e.4           acc_to_row(SHIFT MASK);
            }
6.f         row_to_acc(RESULT);
6.g         required_shift = pow(2, c);
6.h         shift_accip(LEFT, ZERO, required_shift);
6.i         row_AND_accip(SHIFT MASK);
```

```
6.j       row_inv_AND_accip(ELEMENT MASK);
6.k       acc_to_row(TMPSHIFTED MASK)
6.l       row_inv_to_acc(SHIFT MASK);
6.m       row_AND_accip(RESULT);
6.n       row_OR_accip(TMPSHIFTED MASK);
6.o       acc_to_row(RESULT);
6.p       row_to_acc(EFFECTIVE MASK);
6.q       shift_accip(LEFT, ZERO, 1);
6.r       acc_to_row(EFFECTIVE MASK);
     }
```

In the example illustrated in FIG. 4A-4C, a bit-vector value illustrated in bold indicates a change in the value of the bit-vector (e.g., the value of the bit-vector stored in the memory cells corresponding to SHIFT MASK 437 is shown in bold in FIG. 4A to indicate a change from [0x01000001] as shown in association with reference number 6.c to [0x7F00007F] as shown in association with reference number 6.d.4).

The pseudo code corresponding to reference number 1 (e.g., "row_to_row(SRCA, RESULT)") is associated with storing SRCA 443 (e.g., bit-vector 0x04050609) in the memory cells that store the RESULT 441. The pseudo code corresponding to reference number 2 (e.g., "pgen_impl(1, ELEMENT_WIDTH)") is associated with storing the bit-vector 0x01010101 in the sensing circuitry (e.g., compute components 331 and/or sense amplifiers 306). The bit-vector 0x01010101 identifies the least significant bit (LSB) in each of the elements stored as SRCA 443. For example, the bit-vector 0x01010101 identifies a LSB in a first element, a second element, a third element, and a fourth element stored as SRCA 443. In a number of examples, the bit-vector 0x01010101 can be received from a host and/or the bit-vector 0x01010101 can be created via the following pseudo code:

```
2.a       set_acc( );
2.b       shift_accip(RIGHT, ZERO, 1);
2.c       inv_to_row_acc(EFFECTIVE_MASK);
2.d       for (len_t e = 0; e < elements – 1; e++) {
2.d.1         shift_accip(RIGHT, ZERO, ELEMENT_WIDTH);
2.d.2         row_OR_accip(EFFECTIVE MASK);
              }
2.e       shift_accip(RIGHT, ZERO, ELEMENT_WIDTH-1);
2.f       acc_to_row(EFFECTIVE MASK);
```

The pseudo code associated with reference numbers 2.a to 2.f is not shown in FIG. 4A-4B to preserve clarity of the example provided. The pseudo code corresponding to reference number 2.a (e.g., "set_acc( )") is associated with storing the bit-vector 0xFF,FF,FF,FF in the sensing circuitry (e.g., compute components 331 and/or sense amplifiers 306). The pseudo code corresponding to reference number 2.b (e.g., "shift_accip(RIGHT, ZERO, 1)") is associated with performing a right shift operation on COMP_COMP 431 that is stored in the sensing circuitry. The result of the rights shift operation is a bit-vector 0x7F,FF,FF,FF (e.g., COMP_COMP 431 has a value of 0x7F,FF,FF,FF). The bit-vector 0x7F,FF,FF,FF is stored in the sensing circuitry as COMP_COMP 431.

The pseudo code corresponding to reference number 2.c (e.g., "inv_to_row_acc(EFFECTIVE MASK)") is associated with performing an invert operation on COMP_COMP 431 and storing the result of the invert operation in the memory cells that store the EFFECTIVE MASK 433. Performing an invert operation on COMP_COMP 431 results in a bit-vector that identifies the most significant bit in a plurality of first elements stored as SRCA 443 and a plurality of second elements stored as SRCB 445. In this example, performing an invert operation on bit-vector 431 (e.g., 0x7F,FF,FF,FF) results in bit-vector 0x80,00,00,00, which is stored as binary bit-vector [1000 000, 0000 0000, 0000 0000, 0000 0000] in the memory cells that use to store the EFFECTIVE MASK 433. The hexadecimal bit-vector 0X80,00,00,00 (e.g., binary bit-vector [1000 000, 0000 0000, 0000 0000, 0000 0000]) identifies the most significant bit in the plurality of first elements and the plurality of second elements.

The pseudo code corresponding to reference number 2.d (e.g., "for (len_t e=0; e<elements–1; e++)") is associated with performing a "FOR" loop to identify the most significant bit in each element pair from the plurality of first elements and the plurality of second elements using the EFFECTIVE MASK 433. The "FOR" loop associated with reference number 2.d iterates through the quantity of element pairs (e.g., elements). In a number of examples, the quantity of element pairs (e.g., the quantity of element in the plurality of first elements and/or the plurality of second elements) is provided by a host such as host 110 in FIG. 1. However, only the most significant bit associated with three element pairs needs to be identified due to the previous identification of the MSB (e.g., [80,00,00,00]) of the plurality of first elements and the plurality of second elements. As such, the "FOR" loop performs three iterations using "e" as a counter. "E" is set to zero (e.g., 0) in the first iteration of the "FOR" loop and is incremented (e.g., "e++") by one (e.g., 1) before each subsequent iteration of the "FOR" loop. The "FOR" loop terminates (e.g., ends) when "e" is greater than or equal to 3 (e.g., "e<element–1").

The pseudo code corresponding to reference number 2.d.1 (e.g., "shift_accip(RIGHT, ZERO, ELEMENT_WIDTH)") is associated with performing a right shift operation during each iteration of the "FOR" loop referenced in association with reference number 2.d.1. The right shift operation shifts the bits in COMP_COMP 431 towards the LSB in COMP_COMP 431 a quantity of times equal to the ELEMENT_WIDTH, which is equal to eight in this example. For example, in a first iteration of the "FOR" loop the right shift operation associated with reference number 2.d.1 shifts COMP_COMP 431 (e.g., 0x80,00,00,00) resulting in the bit-vector 0x00,80,00,00 being stored in the sensing circuitry as COMP_COMP 431. In a second iteration of the "FOR" loop the right shift operation associated with reference number 2.d shifts COMP_COMP bit-vector 431 0x80,80,00,00 resulting in the bit-vector 0x00,80,80,00 being stored in the sensing circuitry as COMP_COMP 431. In a third iteration of the "FOR" loop the right shift operation associated with reference number 2.D shifts the COMP_COMP bit-vector 431 0x80,80,80,00 resulting in the bit-vector 0x00,80,80,80 being stored in the sensing circuitry as COMP_COMP 431.

The pseudo code corresponding to reference number 2.d.2 (e.g., "row_OR_accip(EFFECTIVE MASK)") is associated with performing an OR operation on COMP_COMP 431 and EFFECTIVE MASK 433. As used herein, performing an OR operation on a first and second bit-vector can include performing, in parallel, the logical operation on each of the respective bits at corresponding bit positions of the bit-vectors. As an example, performing an OR operation can include performing an OR operation on a first bit-vector "a" (e.g., [$a_0$ $a_1$ $a_2$ $a_3$ $a_4$ $a_5$ $a_6$ $a_7$]) and a second bit-vector "b" (e.g., [$b_0$ $b_1$ $b_2$ $b_3$ $b_4$ $b_5$ $b_6$ $b_7$]). Performing an OR operation on "a" and "b" results in a bit-vector "c" (e.g., [$c_0$ $c_1$ $c_2$ $c_3$ $c_4$ $c_5$ $c_6$ $c_7$]), wherein $c_0$=$a_0$ OR $b_0$, $c_1$=$a_1$ OR $b_1$, $c_2$=$a_2$ OR $b_2$, $c_3$=$a_3$ OR $b_3$, $c_4$=$a_4$ OR $b_4$, $c_5$=$a_5$ OR $b_5$, $c_6$=$a_6$ OR $b_6$, and $c_7$=$a_7$ OR $b_7$. Examples of performing OR and AND operations are described in FIGS. 5A-6B.

For example, in the first iteration of the "FOR" loop, the OR operation associated with reference number 2.d.2 is performed on COMP_COMP 431 0x00,80,00,00 and EFFECTIVE MASK 433 0x80,00,00,00 resulting in the bit-vector 0x80,80,00,00 being stored in the sensing circuitry as COMP_COMP 431. In the second iteration of the "FOR" loop, the OR operation associated with reference number 2.d.2 is performed on COMP_COMP 431 0x00,80, 80,00 and EFFECTIVE MASK 433 0x80,00,00,00 resulting in the bit-vector 0x80,80,80,00 being stored in the sensing circuitry as COMP_CINO 431. In the third iteration of the "FOR" loop, the OR operation associated with reference number 2.d.2 is performed on COMP_COMP 431 0x00,80, 80,80 and the EFFECTIVE MASK 433 0x80,00,00,00 resulting in the bit-vector 0x80,80,80,80 being stored in the sensing circuitry as COMP_COMP 431.

The pseudo code corresponding to reference number 2.e (e.g., "shift_accip(RIGHT, ZERO, ELEMENT_WIDTH−1)") is associated with performing a right shift operation on COMP_COMP 431 to prepare the EFFECTIVE MASK 433 to be used in the loop structure associated with reference number 6. The right shift operation shifts the bits in COMP_COMP 431 a quantity of positions equal to the element width minus 1 (e.g., ELEMENT_WIDTH−1) associated with the plurality of first element and the plurality of second elements. For example, in the example provided in FIG. 4A-4C, the right shift operation shifts the bits in COMP_COMP 431 a quantity of positions equal to seven (7). COMP_COMP 431 is a bit-vector 0x80,80,80,80 (e.g., binary [10000000, 10000000, 10000000, 10000000]) before performing the right shift operation and a bit-vector 0x01, 01,01,01 (e.g., binary [00000001, 00000001, 00000001, 00000001]) after performing the right shift operation. The result of the right shift operation is stored in the sensing circuitry as COMP_COMP 431.

The pseudo code corresponding to reference number 2.f (e.g., "acc_to_row(EFFECTIVE MASK)") is associated with writing the data pattern stored in the sensing circuitry (e.g., COMP_COMP 431) to the cells storing the EFFECTIVE MASK 433 in preparation for performing the loop structure corresponding to reference number 6. The pseudo code corresponding to reference number 3 (e.g., "acc_to_row(EFFECTIVE MASK)") is associated with writing the data pattern stored as EFFECTIVE MASK 433 to the sensing circuitry as COMP_COMP 431.

The pseudo code corresponding to reference number 4 (e.g., "shift_accip(LEFT, ZERO, ELEMENT_WIDTH−1)") is associated with performing a LEFT shift operation. The left shift operation shifts the bits in COMP_COMP 431 towards the MSB in COMP_COMP 431 a quantity of times equal to seven. The result of the shift operation is bit-vector 0x80,80,80,80 which is stored as COMP_COMP 431 in the sensing circuitry. The pseudo code corresponding to reference number 5 (e.g., "acc_to_row(ELEMENT MASK)") is associated with writing the data pattern stored in the sensing circuitry (e.g., COMP_COMP 431) to the cells storing ELEMENT MASK 435. For example, the bit-vector 0x80808080 (e.g., COMP_COMP 431) is stored in the memory cells that store ELEMENT MASK 435.

The pseudo code corresponding to reference number 6 (e.g., "for (len_t c=0; c<max_steps; c++)") is associated with performing a "FOR" loop to perform a number of operations associated with performing the shift operation. The "FOR" loop performs a number of operations using "c" as a counter. "C" is set to zero (e.g., 0) in the first iteration of the "FOR" loop and is incremented (e.g., "c++") by one (e.g., 1) before each subsequent iteration of the "FOR" loop. The "FOR" loop terminates (e.g., ends) when "c" is greater than or equal to max_steps (e.g., "c<max_steps"). Max_steps can be calculated using the width of each of the elements in SRCA 443 and/or SRCB 445. For example, max_steps can be equal to $\log_2$ ELEMENT_WIDTH (e.g., max_steps=$\log_2$ ELEMENT_WIDTH). In the example provided in FIGS. 4A-4C, max_steps is equal to three (3). In a number of examples, max_steps can be provided by a host 110, by control circuitry 140, and/or the sense circuitry 150 in FIG. 1.

The pseudo code corresponding to reference number 6.a (e.g., "row_to_acc(SRCB)") is associated with writing SRCB 445 in the sensing circuitry as COMP_COMP 431. The pseudo code corresponding to reference number 6.b (e.g., "acc_AND_accip(EFFECTIVE MASK)") is associated with performing an AND operation on COMP_COMP 431 and EFFECTIVE MASK 433 to isolate a number of bits in SRCB 445. The isolated bits will create the SHIFT MASK 437. The AND operation is performed on the bit-vector 0x03020201 (e.g., SRCB 445) and the bit-vector 0x01,01, 01,01 (e.g., EFFECTIVE MASK 433) resulting in the bit-vector 0x01,00,00,01 being stored in the sensing circuitry.

The pseudo code corresponding to reference number 6.c (e.g., "acc_to_row(SHIFT MASK)") is associated with writing the data pattern stored in the sensing circuitry (e.g., COMP_COMP 431) to the cells storing SHIFT MASK 437. For example, the bit-vector 0x01,00,00,01 (e.g., COMP_COMP 431) is stored in the memory cells that store SHIFT MASK 437.

The pseudo code corresponding to reference number 6.d (e.g., "for (len_t e=0; e<ELEMENT_WIDTH−c−1; e++)") is associated with performing a "FOR" loop (e.g., associated with reference number 6.d) to perform a number of operations in each iteration of the "FOR" loop associated with reference number 6. The "FOR" loop associated with reference number 6.d performs a number of operations using "e" as a counter. "E" is set to zero (e.g., 0) in the first iteration of the "FOR" loop and is incremented (e.g., "e++") by one (e.g., 1) before each subsequent iteration of the "FOR" loop. The "FOR" loop terminates (e.g., ends) when "e" is greater than or equal to ELEMENT_WIDTH minus c minus one (e.g., "e<ELEMENT_WIDTH−c−1"). During the first iteration of the "FOR" loop associated with reference number 6, c is equal to zero (0) and as such ELEMENT_WIDTH (8) minus zero (0) minus one (1) is equal to seven. For example, the "FOR" loop associated with reference number 6d performs seven iterations of operations during a first iteration of the "FOR" loop associated with reference number 6, six iterations of operations during the second iteration of the "FOR" loop associated with reference number 6, and five iterations of operation during the third iteration of the "FOR" loop associated with reference number 6.

In FIG. 4A, reference number 6.d.4 is shown while reference numbers 6.d.1-3 are not shown. Reference number 6.d.4 shows the results of performing the "FOR" loop associated with reference numbers 6.d.1-4.

The pseudo code corresponding to reference number 6.d.1 (e.g., "shift_accip(LEFT, ZERO, 1)") is associated with performing a left shift operation. The left shift operation shifts the bits in COMP_COMP 431 towards the MSB in COMP_COMP 431. For example, in a first iteration of the "FOR" loop associated with reference number 6.d, the left shift operation shifts COMP_COMP 431 (e.g., 0x01,00,00, 01) resulting in the bit-vector 0x02,00,00,02 being stored in the sensing circuitry as COMP_COMP 431. In a second iteration of the "FOR" loop associated with reference number 6.d, the left shift operation shifts COMP_COMP 431 (e.g., 0x03,00,00,03) resulting in the bit-vector 0x06,00,00, 06 being stored in the sensing circuitry as COMP_COMP 431. In a third iteration of the "FOR" loop associated with reference number 6.d, the left shift operation shifts COMP_COMP 431 (e.g., 0x07,00,00,07) resulting in the bit-vector 0x0E,00,00,0E being stored in the sensing circuitry as COMP_COMP 431. In a fourth iteration of the "FOR" loop associated with reference number 6.d, the left shift operation shifts COMP_COMP 431 (e.g., 0x0F,00,00,0F) resulting in the bit-vector 0x1E,00,00,1E being stored in the sensing circuitry as COMP_COMP 431. In a fifth iteration of the "FOR" loop associated with reference number 6.d, the left shift operation shifts COMP_COMP 431 (e.g., 0x1F,00,00, 1F) resulting in the bit-vector 0x3E,00,00,3E being stored in the sensing circuitry as COMP_COMP 431. In a sixth iteration of the "FOR" loop associated with reference number 6.d, the left shift operation shifts COMP_COMP 431 (e.g., 0x3F,00,00,3F) resulting in the bit-vector 0x7E,00,00, 7E being stored in the sensing circuitry as COMP_COMP 431. In a seventh iteration of the "FOR" loop associated with reference number 6.d, the left shift operation shifts COMP_COMP 431 (e.g., 0x7F,00,00,7F) resulting in the bit-vector 0xFE,00,00,FE being stored in the sensing circuitry as COMP_COMP 431.

The pseudo code corresponding to reference number 6.d.2 (e.g., "row_OR_accip(SHIFT MASK)") is associated with performing an OR operation on COMP_COMP 431 and SHIFT MASK 437. For example, in a first iteration of the "FOR" loop associated with reference number 6.d, the OR operation is performed on the bit-vector 0x02,00,00,02 (e.g., COMP_COMP 431) and the bit-vector 0x01,00,00,01 (e.g., SHIFT MASK 437) resulting in the bit-vector 0x03,00,00, 03 being stored in the sensing circuitry as COMP_COMP 431. In a second iteration of the "FOR" loop associated with reference number 6.d, the OR operation is performed on the bit-vector 0x06,00,00,06 (e.g., COMP_COMP 431) and the bit-vector 0x03,00,00,03 (e.g., SHIFT MASK 437) resulting in the bit-vector 0x07,00,00,07 being stored in the sensing circuitry as COMP_COMP 431. In a third iteration of the "FOR" loop associated with reference number 6.d, the OR operation is performed on the bit-vector 0x0E,00,00,0E (e.g., COMP_COMP 431) and the bit-vector 0x07,00,00,07 (e.g., SHIFT MASK 437) resulting in the bit-vector 0x0F, 00,00,0F being stored in the sensing circuitry as COMP_COMP 431. In a fourth iteration of the "FOR" loop associated with reference number 6.d, the OR operation is performed on the bit-vector 0x1E,00,00,1E (e.g., COMP_COMP 431) and the bit-vector 0x0F,00,00,0F (e.g., SHIFT MASK 437) resulting in the bit-vector 0x1F,00,00,1F being stored in the sensing circuitry as COMP_COMP 431. In a fifth iteration of the "FOR" loop associated with reference number 6.d, the OR operation is performed on the bit-vector 0x3E,00,00,3E (e.g., COMP_COMP 431) and the bit-vector 0x1F,00,00,1F (e.g., SHIFT MASK 437) resulting in the bit-vector 0x3F,00,00,3F being stored in the sensing circuitry as COMP_COMP 431. In a sixth iteration of the "FOR" loop associated with reference number 6.d, the OR operation is performed on the bit-vector 0x7E,00,00,7E (e.g., COMP_COMP 431) and the bit-vector 0x3F,00,00,3F (e.g., SHIFT MASK 437) resulting in the bit-vector 0x7F, 00,00,7F being stored in the sensing circuitry as COMP_COMP 431. In a seventh iteration of the "FOR" loop associated with reference number 6.d, the OR operation is performed on the bit-vector 0xFE,00,00,FE (e.g., COMP_COMP 431) and the bit-vector 0x7F,00,00,7F (e.g., SHIFT MASK 437) resulting in the bit-vector 0xFF,00,00,FF being stored in the sensing circuitry as COMP_COMP 431.

The pseudo code corresponding to reference number 6.d.3 (e.g., "row_inv_AND_accip(ELEMENT MASK)") is associated with performing an INVERT operation on ELEMENT MASK 435 and performing an AND operation on the result of the INVERT operation and COMP_COMP 431. For example, in a first iteration of the "FOR" loop associated with reference number 6.d, the INVERT operation performed on ELEMENT MASK 435 (e.g., the bit-vector 0x80,80,80,80) results in the bit-vector 0x7F,7F,7F,7F. The AND operation is performed on the bit-vector 0x7F,7F,7F, 7F (e.g., the result of the INVERT operation) and the bit-vector 0x03,00,00,03 (e.g., COMP_COMP 431), resulting in the bit-vector 0x03,00,00,03 being stored in the sensing circuitry as COMP_COMP 431.

In a second iteration of the "FOR" loop associated with reference number 6.d, the INVERT operation on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0x07000007 (e.g., COMP_COMP 431), resulting in the bit-vector 0x07,00,00, 07 being stored in the sensing circuitry as COMP_COMP 431.

In a third iteration of the "FOR" loop associated with reference number 6.d, the INVERT operation on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0x0F,00,00,0F (e.g., COMP_COMP 431), resulting in the bit-vector 0x0F,00,00, 0F being stored in the sensing circuitry as COMP_COMP 431.

In a fourth iteration of the "FOR" loop associated with reference number 6.d, the INVERT operation on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0x1F,00,00,1F (e.g., COMP_COMP 431), resulting in the bit-vector 0x1F,00,00, 1F being stored in the sensing circuitry as COMP_COMP 431.

In a fifth iteration of the "FOR" loop associated with reference number 6.d, the INVERT operation on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0x3F,00,00,3F (e.g., COMP_COMP 431), resulting in the bit-vector 0x3F,00,00, 3F being stored in the sensing circuitry as COMP_COMP 431.

In a sixth iteration of the "FOR" loop associated with reference number 6.d, the INVERT operation on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0x7F,00,00,7F (e.g., COMP_COMP 431), resulting in the bit-vector 0x7F,00,00, 7F being stored in the sensing circuitry as COMP_COMP 431.

In a seventh iteration of the "FOR" loop associated with reference number 6.d, the INVERT operation on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0xFF,00,00,FF (e.g., COMP_COMP 431), resulting in the bit-vector 0x7F,00,00, 7F being stored in the sensing circuitry as COMP_COMP 431.

The pseudo code corresponding to reference number 6.d.4 (e.g., "acc_to_row(SHIFT MASK)") is associated with writing the data pattern stored in the sensing circuitry (e.g., COMP_COMP 431) to the cells storing SHIFT MASK 437. For example, in a seventh iteration of the "FOR" loop associated with reference number 6.d, the bit-vector 0x7F00007F (e.g., COMP_COMP 431) is stored in the memory cells that store SHIFT MASK 437.

The pseudo code corresponding to reference number 6.e (e.g., "for (len_t e=0; e<c; e++)") is associated with performing a "FOR" loop (e.g., associated with reference number 6.e) to perform a number of operations in each iteration of the "FOR" loop associated with reference number 6. The "FOR" loop associated with reference number 6.e performs a number of operations using "e" as a counter. "E" is set to zero (e.g., 0) in the first iteration of the "FOR" loop and is incremented (e.g., "e++") by one (e.g., 1) before each subsequent iteration of the "FOR" loop. The "FOR" loop terminates (e.g., ends) when "e" is greater than or equal to c (e.g., "e<c"). During the first iteration of the "FOR" loop associated with reference number 6, c is equal to zero (0), such that in the first iteration of the "FOR" loop associated with reference number 6 the "FOR" loop terminated without executing the pseudo code associated with 6.e.1-4. However, the pseudo code associated with reference number 6.e is described herein for clarity.

The pseudo code corresponding to reference number 6.e.1 (e.g., "shift_accip(RIGHT, ZERO, 1)") is associated with performing a right shift operation. The right shift operation shifts the bits in COMP_COMP 431 towards the LSB in COMP_COMP 431 and stores the result in the sensing circuitry as COMP_COMP 431. The pseudo code corresponding to reference number 6.e.2 (e.g., "row_OR_accip (SHIFT MASK)") is associated with performing an OR operation on COMP_COMP 431 and SHIFT MASK 437 and storing the results of the OR operation in the sensing circuitry as COMP_COMP 431.

The pseudo code corresponding to reference number 6.e.3 (e.g., "row_inv_AND_accip(ELEMENT MASK)") is associated with performing an INVERT operation on ELEMENT MASK 435, performing an AND operation on the result of the INVERT operation and COMP_COMP 431, and storing the result of the AND operation in the sensing circuitry as COMP_COMP 431. The pseudo code corresponding to reference number 6.e.4 (e.g., "acc_to_row (SHIFT MASK)") is associated with writing the data pattern stored in the sensing circuitry (e.g., COMP_COMP 431) to the cells storing SHIFT MASK 437.

The pseudo code corresponding to reference number 6.f (e.g., "row_to_acc(RESULT)") is associated with writing RESULT 441 in the sensing circuitry as COMP_COMP 431. The pseudo code corresponding to reference number 6.g (e.g., "required_shift=pow(2, c)") is associated with calculating a number of bit positions by which SRCA 443 is shifted. The number of bit positions (e.g., required_shift) is equal to two to the power of c (e.g., $2^c$). In a number of examples, $2^c$ can be provided by host 110 and/or control circuitry 140 in FIG. 1. $2^c$ can also be calculated in the sense circuitry 150 in FIG. 1. C can be referred to herein as a current bit index. For example, C can be used to iteration through a number of indexes associated with SRCB 445. In a first iteration of the "FOR" loop associated with reference number 6, the number of bit positions is equal to 1. For example, the number of bit positions by which SRCA 443 is calculated from the 1-bits in SRCB 445 and an associate index.

Each bit from SRCB 445 is associated with an index. For example, a LSB from each of the elements in SRCB 445 is associated with a first index (e.g., 0) while a MSB from each of the elements in SRCB 445 is associated with a last index. A 1-bit in the first index of a bit-vector that represents an element in SRCB 445 can be interpreted as an indication that an associated element in SRCA 443 be shifted one bit position towards a MSB in a first iteration of the "FOR" loop associated with reference number 6, a 1-bit that is associated with a next to first index (e.g., 1) can be interpreted to indicate that an associated element in SRCA 443 be shifted two bit positions towards a MSB, in a second iteration of the "FOR" loop associated with reference number 6, a 1-bit that is associated with a next to next to first index (e.g., 2) can be interpreted to indicate that an associated element in SRCA 443 be shifted four bit positions towards a MSB, in a third iteration of the "FOR" loop associated with reference number 6, etc. In a number of examples, the bits can be shifted towards a LSB.

The pseudo code corresponding to reference number 6.h (e.g., "shift_accip(LEFT, ZERO, required_shift)") is associated with performing a left shift operation. The left shift operation shifts the bits in COMP_COMP 431 (e.g., 0x04, 05,06,09) towards the MSB in COMP_COMP 431 a number of bit positions equal to required_shift. In the first iteration of the "FOR" loop associated with reference number 6, the bits in COMP_COMP 431 are shifted within towards the MSB one bit position. Shifting bits in COMP_COMP 431 can include shifting bits from a first sense amplifier 306 and/or compute component 331 to a second sense amplifier 306 and/or compute component 331, wherein the first sense amplifier 306 and/or compute component 331 is associated with a first index of a bit-vector and a second sense amplifier 306 and/or compute component 331 is associated with a second index and wherein the first index is associated with a first bit in the bit-vector that is a less significant bit than a second bit that is associated with the second index in the bit-vector. Shifting the bits in COMP_COMP 431 can result in the bit-vector 0x080A0C12 being stored in the sensing circuitry as COMP_COMP 431.

The pseudo code corresponding to reference number 6.i (e.g., "row_AND_accip(SHIFT MASK)") is associated with performing an AND operation on COMP_COMP 431 and SHIFT MASK 437 to isolate the shifted elements from SRCA 443 that correspond with elements from SRCB 445 having 1-bits in particular index. For example, SHIFT MASK 437 (e.g., 0x7F,00,00,7F) can be used to isolate a shifted element of a most significant element having a bit-vector 0x08 which corresponds to the un-shifted bit-vector 0x04 from SRCA 443 (e.g., 0x04,05,06,09) and a shifted element of a least significant element having a bit-vector 0x12 which corresponds to the un-shifted bit-vector 0x09 from SRCA 443 (e.g., 0x04,05,06,09). The most significant element and the least significant element are shifted due to SRCB 445 (e.g., binary bit-vector [0000 0011, 0000 0010, 0000 0010, 0000 0001]) having a 1-bit as a LSB in the least significant element and the most significant element that each corresponds to the 1-bit in the LSB position in the EFFECTIVE MASK 433 (e.g., 0x01,01,01, 01) being ANDed with SRCB 445 (0x03,02,02,01) at 496-6.b. For this first iteration, the least significant bit is used to correspond to the SRCB 445 (0x03,02,02,01). When the least significant bit positions includes a "0," the elements would not be shifted (as described below in association with 6.m below) because SRCB 445 (0x03,02,02,01) ANDed with EFFECTIVE MASK 533 (0x01,01,01,01) results in (0x01,00,00,01). The result of performing the AND operation on COMP_COMP 431 (e.g., 0x08,0A,0C,12) and SHIFT MASK 437 (e.g., 0x7F,00,00,7F) is the bit-vector 0x08,00,00,12 which is stored in the sensing circuitry as COMP_COMP 431.

The pseudo code corresponding to reference number 6.j (e.g., "row_inv_AND_accip(ELEMENT MASK)") is associated with performing an INVERT operation on ELEMENT MASK 435 and performing an AND operation on the result of the INVERT operation and COMP_COMP 431 to create a mask that can be used to isolate bits from being shifted from one element to a different element in SRCA 443. The INVERT operation performed on ELEMENT MASK 435 (e.g., the bit-vector 0x80,80,80,80) results in the bit-vector 0x7F,7F,7F,7F. The AND operation is performed on the bit-vector 0x7F,7F,7F,7F (e.g., the result of the INVERT operation) and the bit-vector 0x08,00,00,12 (e.g., COMP_COMP 431), resulting in the bit-vector 0x08,00,00,12 being stored in the sensing circuitry as COMP_COMP 431.

The pseudo code corresponding to reference number 6.k (e.g., "acc_to_row(TMPSHIFTED MASK)") is associated with storing the bit pattern of COMP_COMP 431 in the memory cells that store TMPSHIFTED MASK 439 to store the shifted elements from SRCA 443 that were isolated in association with reference number 6.i while the un-shifted elements from SRCA 443 are isolated. For example, the bit-vector 0x08,00,00,12 (e.g., COMP_COMP 431) is stored in the memory cells that store TMPSHIFTED MASK 439. As such, TMPSHIFTED MASK 439 is used to store the shifted elements from SRCA 443 that are isolated from the un-shifted elements form SRCA 443.

The pseudo code corresponding to reference number 6.l (e.g., "row_inv_to_acc(SHIFT MASK)") is associated with performing an INVERT operation on SHIFTED MASK 437 and storing the result in the sensing circuitry as COMP_COMP 431 to create a mask that can be used to isolated un-shifted elements from SRCA 443. Inverting a bit-vector 0x7F,00,00,7F (e.g., SHIFTED MASK 437) can result in the bit-vector 0x80,FF,FF,80 being stored in the sensing circuitry as COMP_COMP 431.

The pseudo code corresponding to reference number 6.m (e.g., "row_AND_accip(RESULT)") is associated with performing an AND operation on COMP_COMP 431 and RESULT 441 to isolate the un-shifted elements from SRCA 443 that correspond with elements from SRCB 445 having 0-bits in particular index. For example, the bit-vector 0x80, FF,FF,80 can be used to isolate an un-shifted element having a bit-vector 0x05 from SRCA 443 (e.g., 0x04,05,06,09) and an un-shifted element having a bit-vector 0x06 from SRCA 443 (e.g., 0x04,05,06,09) due to SRCB 445 (e.g., binary bit-vector [0000 0011, 0000 0010, 0000 0010, 0000 0001]) having a 0-bit in a bit with a 0-index in the two elements between the least significant element and the most significant element. The result of performing the AND operation on COMP_COMP 431 (e.g., 0x80,FF,FF,80) and RESULT 441 (e.g., 0x04,05,06,09) is the bit-vector 0x00,05,06,00 which is stored in the sensing circuitry as COMP_COMP 431.

The pseudo code corresponding to reference number 6.n (e.g., "row_OR_accip(TMPSHIFTED MASK)") is associated with performing an OR operation on COMP_COMP 431 and TMPSHIFTED MASK 439 to merge the shifted elements and the un-shifted elements both of which are isolated from each other. The OR operation is performed on the bit-vector 0x00,05,06,00 (e.g., COMP_COMP 431) and the bit-vector 0x08,00,00,12 (e.g., TMPSHIFTED MASK 439) resulting in the bit-vector 0x08,05,06,12 being stored in the sensing circuitry as COMP_COMP 431.

The pseudo code corresponding to reference number 6.o (e.g., "acc_to_row(RESULT)") is associated with storing the bit pattern of COMP_COMP 431 in the memory cells that store RESULT 441 to store the result of an iteration of the "FOR" loop that is associated with reference number 6. For example, the pseudo code corresponding to reference number 6.o stores the result of shifting the bits in SRCA 443 a first number of bit positions in a first iteration of the "FOR" loop associated with reference number 6, stores the results of shifting the bits in SRCA 443 a second number of bit positions in a second iteration of the "FOR" loop associated with reference number 6, and stores the results of shifting the bits in SRCA 443 a third number of bit positions in a third iteration of the "FOR" loop associated with reference number 6. The bit-vector 0x08,05,06,12 is stored in the memory cells that store RESULT 441.

The pseudo code corresponding to reference number 6.p-r is associated with updating the EFFECTIVE MASK 433. The pseudo code corresponding to reference number 6.p (e.g., "row_to_acc(EFFECTIVE MASK)") is associated with storing the bit pattern of EFFECTIVE MASK 433 in the sensing circuitry. For example, the bit-vector 0x01,01, 01,01 is stored in the sensing circuitry as COMP_COMP. The pseudo code corresponding to reference number 6.q (e.g., "shift_accip(LEFT, ZERO, 1)") is associated with performing a left shift operation on COMP_COMP 431 produce a bit-vector that can be used to identify bits having a particular index. Shifting the bit-vector 0x01,01,01,01 results in the bit-vector 0x02,02,02,02 being stored in the sensing circuitry as COMP_COMP 431. The pseudo code corresponding to reference number 6.r (e.g., "acc_to_row (EFFECTIVE MASK)") is associated with storing COMP_ COMP 431 in the memory cells that store EFFECTIVE MASK 433. For example, the bit-vector 0x02,02,02,02 (e.g., COMP_COMP 431) is stored in the memory cells that store EFFECTIVE MASK 433.

In a second iteration, shown in FIG. 4B, of the "FOR" loop associated with reference number 6, the pseudo code corresponding to reference number 6 (e.g., "for (len_t c=0; c<max_steps; c++)") increments c such that c is equal to one (1). The "FOR" loop continues due to c being less than three (3).

In the second iteration of reference number 6.a, the bit-vector 0x03,02,02,01 is stored in the sensing circuitry as COMP_COMP 431. In the second iteration of reference number 6.b an AND operation is performed on the bit-vector 0x03020201 (e.g., SRCB 445) and the bit-vector 0x02,02, 02,02 (e.g., EFFECTIVE MASK 433) resulting in the bit-vector 0x02,02,02,00 being stored in the sensing circuitry.

In the second iteration of reference number 6.c, the bit-vector 0x02,02,02,00 (e.g., COMP_COMP 431) is stored in the memory cells that store SHIFT MASK 437. In the second iteration of reference number 6.d, a number of operations are performs using a "FOR" loop. After performing the "FOR" loop associated with reference number 6d, the bit-vector 0x7E,7E,7E,00 (e.g., COMP_COMP 431) is stored in the memory cells that store SHIFT MASK 437. In the second iteration of reference number 6.e, a number of operations are performs using a "FOR" loop. After performing the "FOR" loop associated with reference number 6e, the bit-vector 0x7F,7F,7F,00 (e.g., COMP_COMP 431) is stored in the memory cells that store SHIFT MASK 437.

In the second iteration of reference number 6.e, the "FOR" loop associated with reference number 6.e performs a number of operations using "e" as a counter. "E" is set to zero (e.g., 0) in the first iteration of the "FOR" loop and is incremented (e.g., "e++") by one (e.g., 1) before each subsequent iteration of the "FOR" loop. The "FOR" loop terminates (e.g., ends) when "e" is greater than or equal to c (e.g., "e<c"). During the second iteration of the "FOR" loop associated with reference number 6, c is equal to zero (1), such that the "FOR" loop associated with reference number 6.e terminated after executing an iteration of operations associated with the "FOR" loop associated with reference number 6.e.

In the second iteration of reference number 6.f, the bit-vector 0x08,05,06,12 (e.g., RESULT 441) is stored in the sensing circuitry as COMP_COMP 431. In the second iteration of reference number 6.g, required_shift is equal to 2 (e.g., $2^1$=2). In the second iteration of reference number 6.h, a left shift operation shifts the bits in COMP_COMP 431 (e.g., 0x08,05,06,12) towards the MSB in COMP_COMP 431 a number of bit positions equal to required_shift. The result of the left shift operation is a bit-vector 0x20,14,18,48 which is stored in the sensing circuitry as COMP_COMP 431.

In the second iteration of reference number 6.i, an AND operation is performed on bit-vector 0x20,14,18,48 (e.g., COMP_COMP 431) and bit-vector 0x7F,7F,7F,00 (e.g., SHIFT MASK 437). For example, bit-vector 0x20,14,18,48 is ANDed with 0x7F,7F,7F,00 in order to isolate the shifted elements from SRCA 443 that correspond with elements from SRCB 445 having 1-bits in a particular index. In this second iteration, the values of the SHIFT MASK 437 (e.g., 0x7F,7F,7F,00) indicate whether a value of the SRCB 445 (e.g., 0x03,02,02,01) corresponds to a second least significant bit position (e.g., illustrated by EFFECTIVE MASK 433 [0x02,02,02,02]). In this example, the result of the AND operation is a bit-vector 0x20,14,18,00 which is stored in the sensing circuitry as COMP_COMP 431.

In the second iteration of reference number 6.j, an INVERT operation is performed on the bit-vector 0x80,80,80,80 (e.g., ELEMENT MASK 435). An AND operation is performed on the bit-vector 0x7F,7F,7F,7F (e.g., the result of the INVERT operation) and the bit-vector 0x20,14,18,00 (e.g., COMP_COMP 431), resulting in the bit-vector 0x20,14,18,00 being stored in the sensing circuitry as COMP_COMP 431.

In the second iteration of reference number 6.k, the bit-vector 0x20,14,18,00 (e.g., COMP_COMP 431) is stored in the memory cells that store TMPSHIFTED MASK 439. In the second iteration of reference number 6.l, the bit-vector 0x7F,7F,7F,00 (e.g., SHIFTED MASK 437) is inverted resulting in the bit-vector 0x80,80,80,FF being stored in the sensing circuitry as COMP_COMP 431.

In the second iteration of reference number 6.m, the bit-vector 0x80,80,80,FF (e.g., COMP_COMP 431) is ANDed with the bit-vector 0x08,05,06,12 (e.g., RESULT 441), resulting in the bit-vector 0x00,00,00,12 which is stored in the sensing circuitry as COMP_COMP 431. For example, the bit-vector 0x80,80,80,FF can be used to isolate an un-shifted element having a bit-vector 0x12 from RESULT 441 (e.g., 0x08,00,00,12). In the second iteration of reference number 6.n, an OR operation is performed on the bit-vector 0x00,00,00,12 (e.g., COMP_COMP 431) and the bit-vector 0x20,14,18,00 (e.g., TMPSHIFTED MASK 439) resulting in the bit-vector 0x20,14,18,12 being stored in the sensing circuitry as COMP_COMP 431. In the second iteration of reference number 6.o, the bit-vector 0x20,14,18,12 (e.g., COMP_COMP 431) is stored in the memory cells that store RESULT 441.

In the second iteration of reference number 6.p, the bit-vector 0x02,02,02,02 is stored in the sensing circuitry as COMP_COMP 431. In the second iteration of reference number 6.q, the bit-vector 0x02,02,02,02 (e.g., COMP_COMP 431) is shifted, resulting in the bit-vector 0x04,04,04,04 being stored in the sensing circuitry as COMP_COMP 431. In the second iteration of reference number 6.r, the bit-vector 0x04,04,04,04 (e.g., COMP_COMP 431) is stored in the memory cells that store EFFECTIVE MASK 433.

In a third iteration, shown in FIG. 4C, of the "FOR" loop associated with reference number 6, the pseudo code corresponding to reference number 6 increments c such that c is equal to two (2). The "FOR" loop continues due to c being less than three (3).

In a third iteration of reference number 6.a, the bit-vector 0x03,02,02,01 is stored in the sensing circuitry as COMP_COMP 431. In a third iteration of reference number 6.b an AND operation is performed on the bit-vector 0x03020201 (e.g., SRCB 445) and the bit-vector 0x04,04,04,04 (e.g., EFFECTIVE MASK 433) resulting in the bit-vector 0x00,00,00,00 being stored in the sensing circuitry.

In a third iteration of reference number 6.c, the bit-vector 0x00,00,00,00 (e.g., COMP_COMP 431) is stored in the memory cells that store SHIFT MASK 437. In the third iteration of reference number 6.d, a number of operations are performs using a "FOR" loop. After performing the "FOR" loop associated with reference number 6d, the bit-vector 0x00,00,00,00 (e.g., COMP_COMP 431) is stored in the memory cells that store SHIFT MASK 437. In the third iteration of reference number 6.e, a number of operations are performs using a "FOR" loop. After performing the "FOR" loop associated with reference number 6e, the bit-vector 0x00,00,00,00 (e.g., COMP_COMP 431) is stored in the memory cells that store SHIFT MASK 437. In the third iteration of reference number 6.e, the bit-vector 0x00,00,00,00 is stored in the memory cells that store SHIFT MASK 437.

In the third iteration of reference number 6.f, the bit-vector 0x20,14,18,00 (e.g., RESULT 441) is stored in the sensing circuitry as COMP_COMP 431. In the third iteration of reference number 6.g, required_shift is equal to 4 (e.g., $2^2$=4). In the third iteration of reference number 6.h, a left shift operation shifts the bits in the bit-vector 0x20,14,18,12 (e.g., COMP_COMP 431) towards the MSB in COMP_COMP 431 a number of bit positions equal to required_shift. The result of the left shift operation is a bit-vector 0x01,41,81,20 which is stored in the sensing circuitry as COMP_COMP 431.

In the third iteration of reference number 6.i, an AND operation is performed on bit-vector 0x01,41,81,20 (e.g., COMP_COMP 431) and bit-vector 0x00,00,00,00 (e.g., SHIFT MASK 437). For example, bit-vector 0x01,41,81,20 is ANDed with 0x00,00,00,00 in order to isolate the shifted elements from SRCA 443 that correspond with elements from SRCB 445 having 1-bits in a particular index. In this third iteration, the values of the SHIFT MASK 437 (e.g., 0x00,00,00,00) indicate whether a value of the SRCB 445 (e.g., 0x03,02,02,01) corresponds to a third least significant bit position (e.g., illustrated by EFFECTIVE MASK 433 [0x04,04,04,04]). And since, in this example, none of the "1" bits of the SRCB 445 bit-vector (0x03,02,02,01) correspond to the EFFECTIVE MASK 433 bit-vector (0x04,04, 04,04), the result of the AND operation is a bit-vector 0x00,00,00,00 which is stored in the sensing circuitry as COMP_COMP 431.

In the third iteration of reference number 6.j, an INVERT operation is performed on the bit-vector 0x80,80,80,80 (e.g., ELEMENT MASK 435). An AND operation is performed on the bit-vector 0x7F,7F,7F,7F (e.g., the result of the INVERT operation) and the bit-vector 0x00,00,00,00 (e.g., COMP_COMP 431), resulting in the bit-vector 0x00,00,00,00 being stored in the sensing circuitry as COMP_COMP 431.

In the third iteration of reference number 6.k, the bit-vector 0x00,00,00,00 (e.g., COMP_COMP 431) is stored in the memory cells that store TMPSHIFTED MASK 439. In the third iteration of reference number 6.l, the bit-vector 0x00,00,00,00 (e.g., SHIFTED MASK 437) is inverted resulting in the bit-vector 0xFF,FF,FF,FF being stored in the sensing circuitry as COMP_COMP 431.

In the third iteration of reference number 6.m, the bit-vector 0xFF,FF,FF,FF (e.g., COMP_COMP 431) is ANDed with the bit-vector 0x20,14,18,12 (e.g., RESULT 441), resulting in the bit-vector 0x20,14,18,12 which is stored in the sensing circuitry as COMP_COMP 431. For example, the bit-vector 0xFF,FF,FF,FF can be used to isolate un-shifted elements including bit-vectors 0x20, 0x14, 0x18, and 0x12 from RESULT 441 (e.g., 0x20,14,18,12). In the third iteration of reference number 6.n, an OR operation is performed on the bit-vector 0x20,14,18,12 (e.g., COMP_COMP 431) and the bit-vector 0x00,00,00,00 (e.g., TMPSHIFTED MASK 439) resulting in the bit-vector 0x20,14,18,00 being stored in the sensing circuitry as COMP_COMP 431. In the third iteration of reference number 6.o, the bit-vector 0x20,14,18,12 (e.g., COMP_COMP 431) is stored in the memory cells that store RESULT 441.

In the third iteration of reference number 6.p, the bit-vector 0x04,04,04,04 is stored in the sensing circuitry as COMP_COMP 431. In the third iteration of reference number 6.q, the bit-vector 0x04,04,04,04 (e.g., COMP_COMP 431) is shifted, resulting in the bit-vector 0x08,08,08,08 being stored in the sensing circuitry as COMP_COMP 431. In the third iteration of reference number 6.r, the bit-vector 0x08,08,08,08 (e.g., COMP_COMP 431) is stored in the memory cells that store EFFECTIVE MASK 433.

Embodiments however, are not limited to the order of the sequence of instructions in the pseudo code in this example. For example, a number of operations reference in particular reference number can be performed before a number of operations reference in different reference number are performed.

The functionality of the sensing circuitry 250-2 of FIG. 2A is described below and summarized in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 and/or 205-2).

Figure 5A:
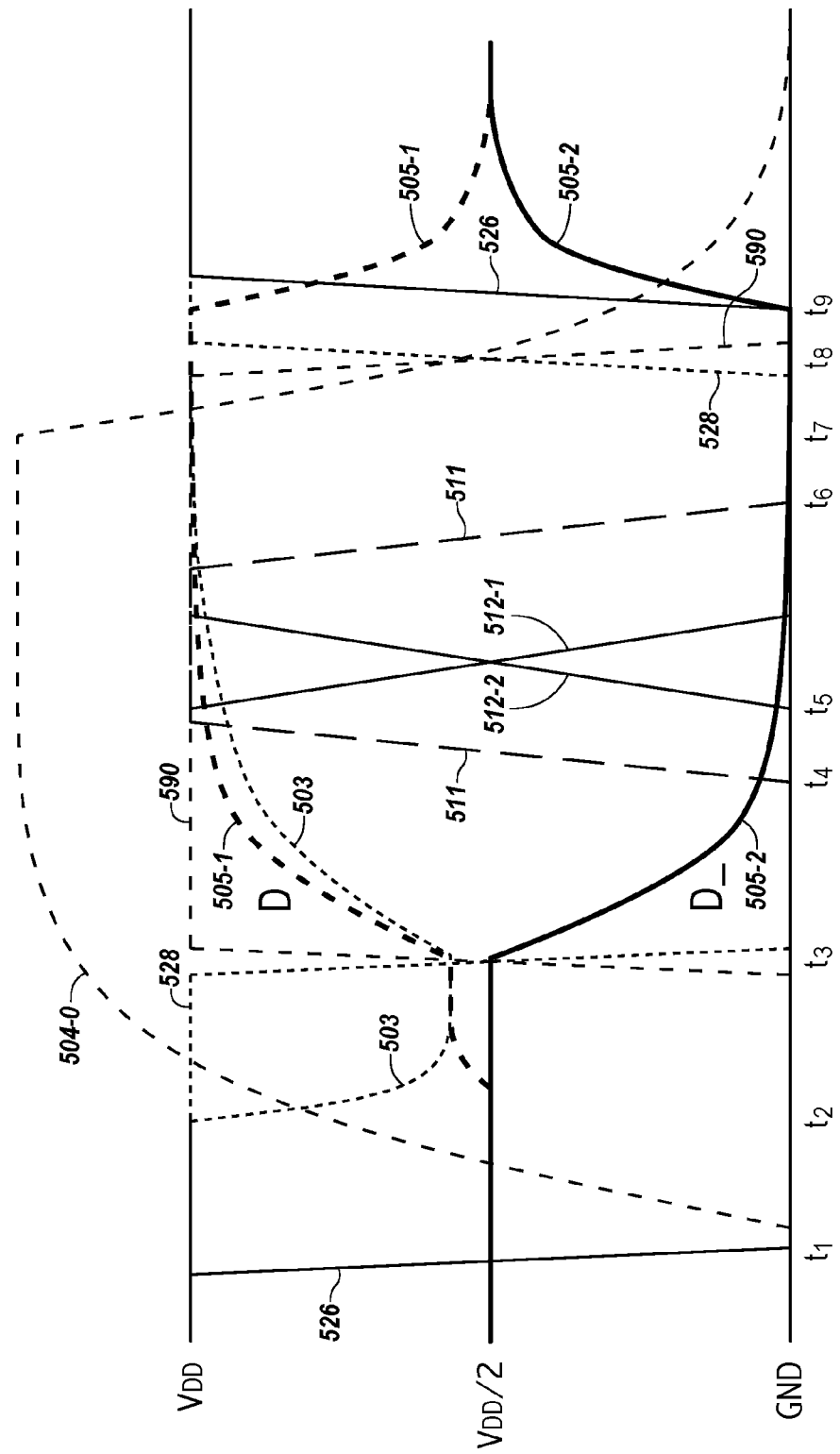
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250-2 of FIG. 2A is described below with respect to performing logical operations and initially storing a result in the compute component 231-2 (e.g., secondary latch of the accumulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground for accessing I/O lines).

In the example illustrated in FIG. 5a, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 shown in FIG. 2A if the cell is a 1T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy. However, the energy associated with enabling/disabling the row signal 504-0 is distributed over the plurality of memory cells coupled to the row.

At time $t_3$, the sense amplifier (e.g., 206-2 shown in FIG. 2A) is enabled. As shown, a positive control signal 590, e.g., corresponding to ACT 265 shown in FIG. 2B, goes high and the negative control signal 528, e.g., corresponding to RnIF 228 shown in FIG. 2B, goes low. This amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206-2 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the accumulator negative control signal 512-1 (e.g., Accumb) and the accumulator positive control signal 512-2 (e.g., Accum) are activated via respective control lines 212-1 and 212-2 shown in FIG. 2A. As described below, the accumulator control signals ACCUMB 512-1 and ACCUM 512-2 may remain activated for subsequent operation phases. As such, in this example, activating the control signals ACCUMB 512-1 and ACCUM 512-2 enables the secondary latch (e.g., accumulator) of compute component 231-2 shown in FIG. 2A. The sensed data value stored in sense amplifier 206-2 is transferred (e.g., copied) to the secondary latch, including the dynamic latch and static latch 264, as shown in FIG. 2A.

At time $t_6$, the Passd control signal 511 (and the Passdb control signal) goes low thereby turning off the pass transistors (if present). However, since the accumulator control signals ACCUMB 512-1 and ACCUM 512-2 remain activated, an accumulated result is stored (e.g., latched) in the secondary latches (e.g., accumulator). At time $t_7$, the row signal 504-0 is deactivated, and the array sense amps are disabled at time $t_8$ (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
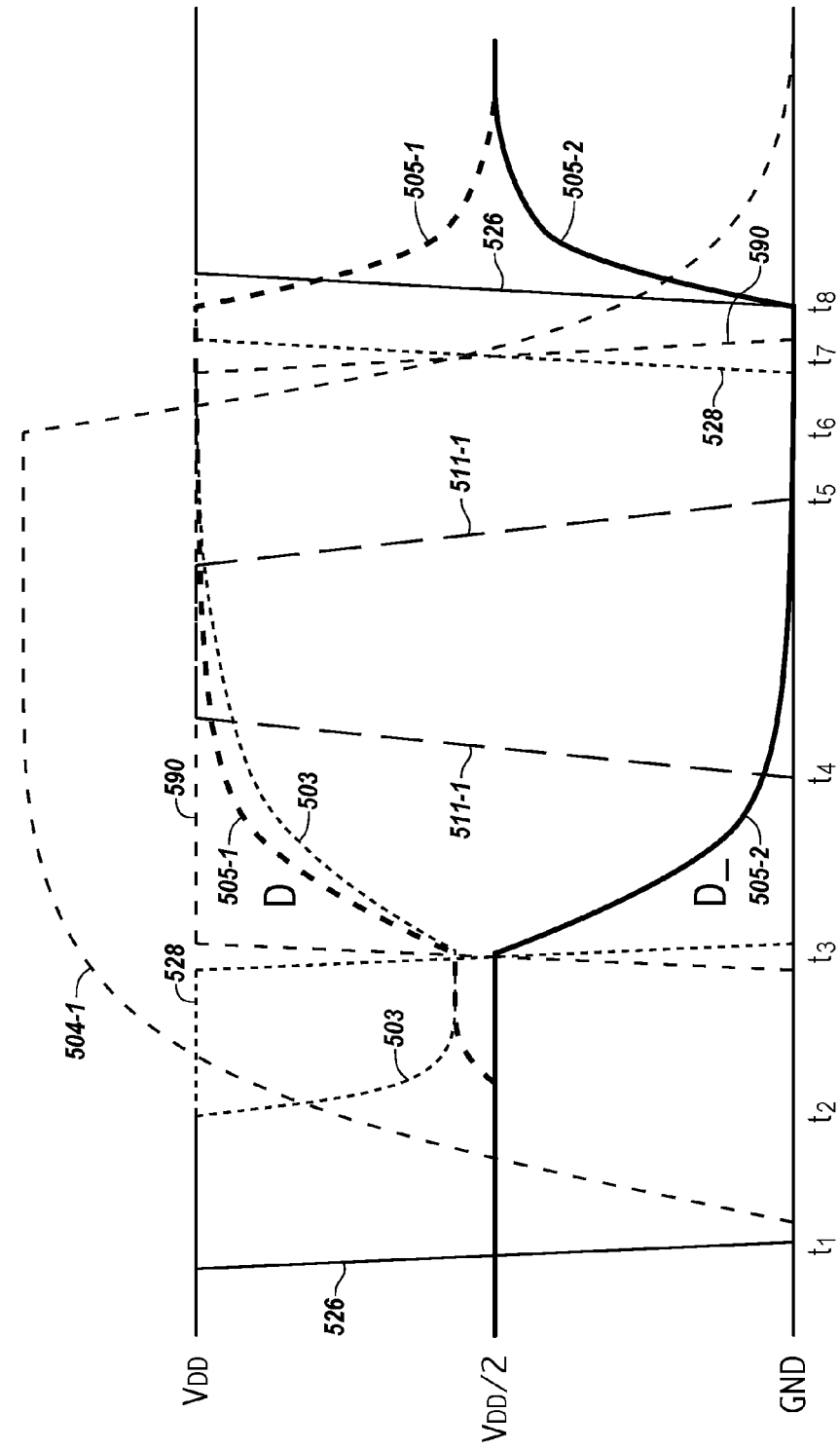
Figure 5C:
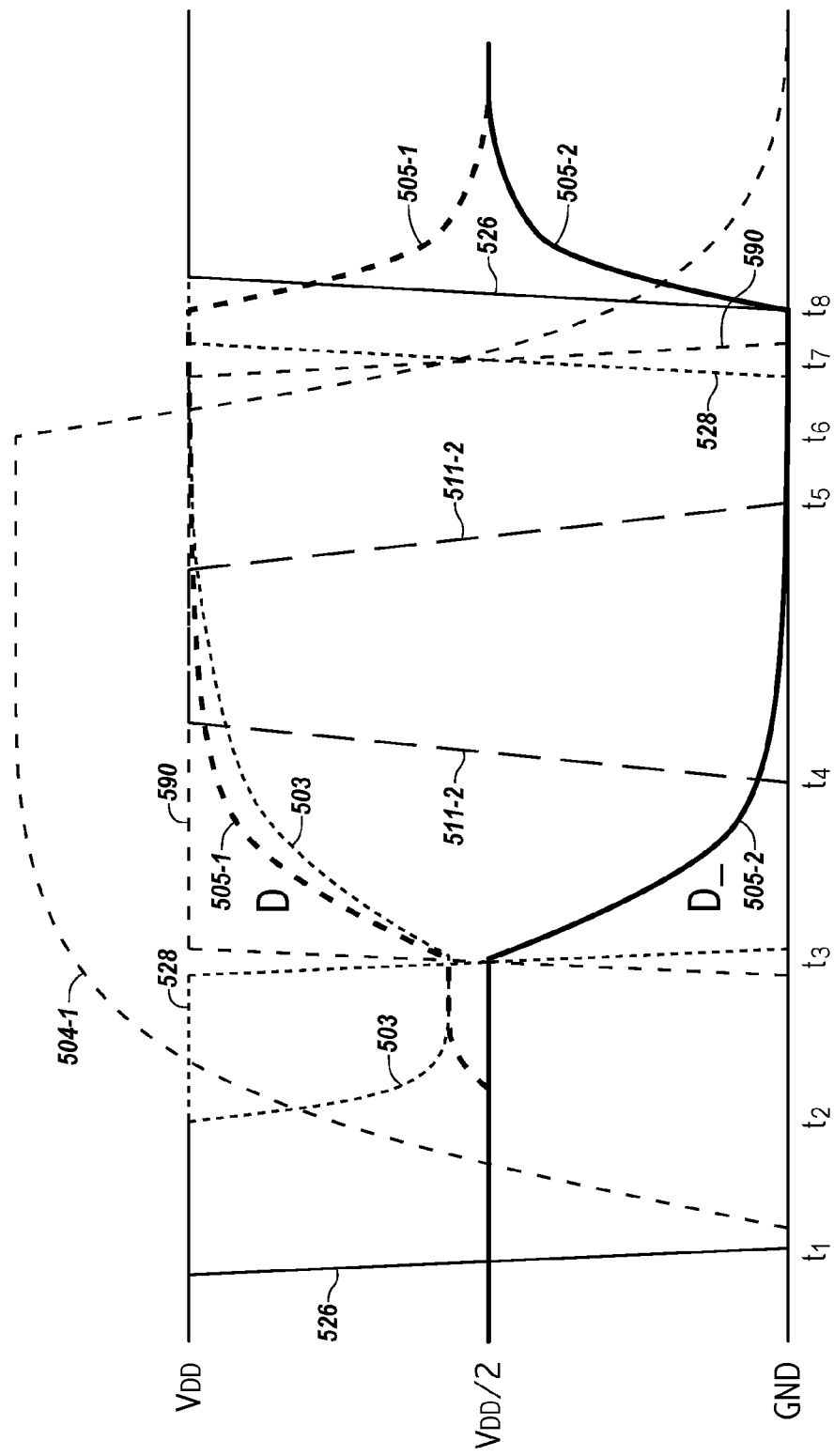

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to FIG. 5C one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy. However, the energy associated with activating/deactivating the row signal 504-1 can be amortized over the plurality of memory cells coupled to the row.

At time $t_3$, the sense amplifier (e.g., 206-2 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low). This amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time $t_4$ to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time $t_4$ to turn on the pass transistor coupling the primary latch to data line D_ and control signal Passd remains deactivated leaving the pass transistor coupling the primary latch to data line D turned off. Recall from above that the accumulator control signals 512-1 (Accumb) and 512-2 (Accum) were activated during the initial operation phase described with respect to FIG. 5A, and they remain activated during the intermediate operation phase(s).

Since the accumulator was previously enabled, activating only Passd (511-1 as shown in FIG. 5B) results in accumulating the data value corresponding to the voltage signal 505-1 shown in FIG. 5B corresponding to data line D. Similarly, activating only Passdb (511-2 as shown in FIG. 5C) results in accumulating the data value corresponding to the voltage signal 505-2 corresponding to data line D_. For instance, in an example AND/NAND operation shown in the timing diagram illustrated in FIG. 5B in which only Passd (511-1) is activated, if the data value stored in a second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 5C in which only Passdb 511-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 505-2 on D_ is setting the true, e.g., "1", data value of the accumulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 5B or 5C can be repeated in order to accumulate results from a number of additional rows. As an example, the sequence of timing diagram illustrated in FIGS. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
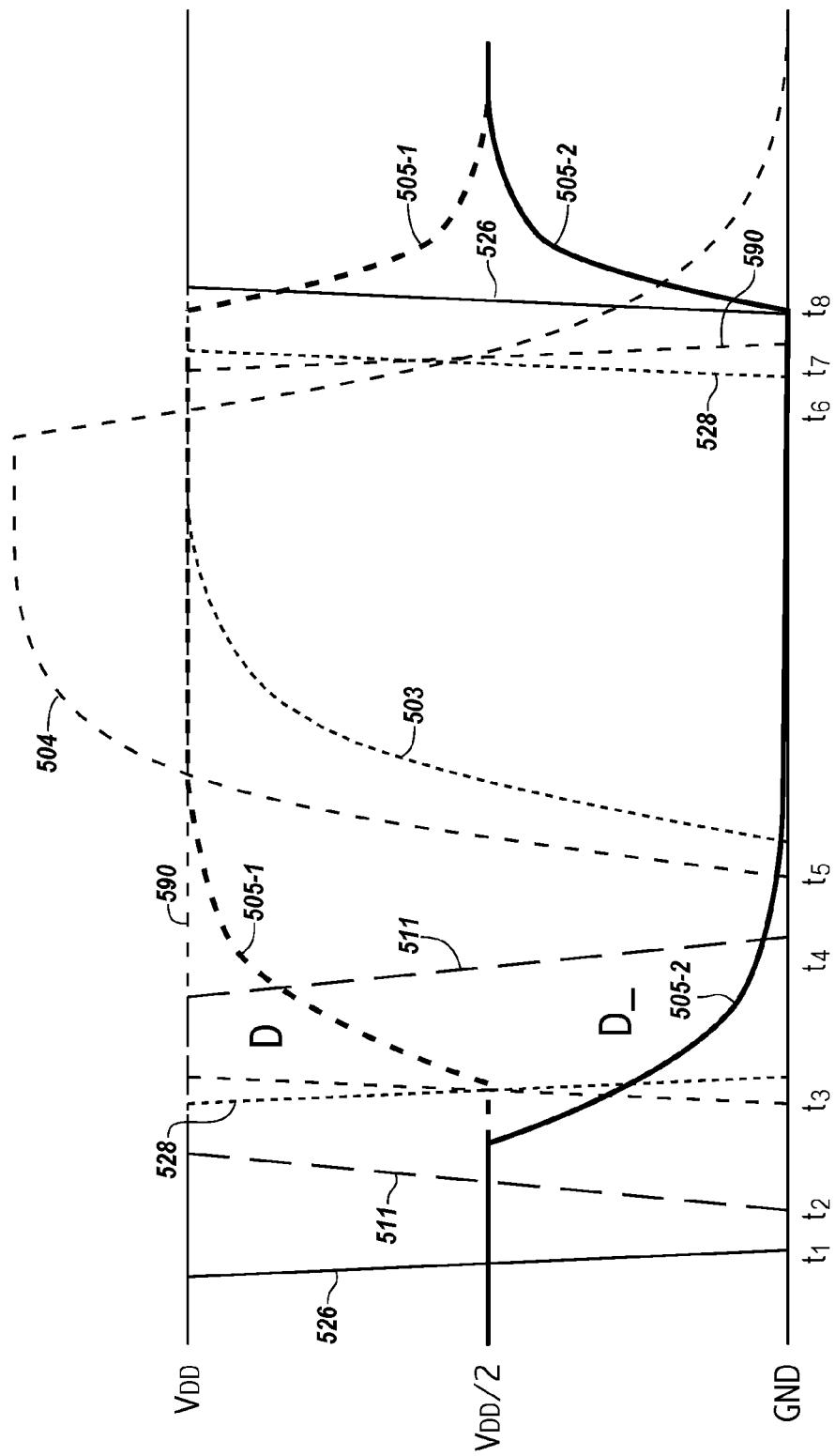

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 2 shown below indicates the Figures corresponding to the sequence of operation phases associated with performing a number of R-input logical operations in accordance with a number of embodiments described herein.

TABLE 2

| Operation | FIG. 5A | FIG. 5B | FIG. 5C | FIG. 5D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time t2, the Passd control signal 511 (and Passdb signal) is activated for an AND or OR operation.

Activating the Passd control signal 511 (and Passdb signal) (e.g., in association with an AND or OR operation) transfers the accumulated output stored in the secondary latch of compute component 231-2 shown in FIG. 2A to the primary latch of sense amplifier 206-2. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206-2 is then enabled (e.g., a positive control signal 590 (e.g., corresponding to ACT 265 shown in FIG. 2B) goes high and the negative control signal 528 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206-2 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time t3, the positive control signal 590 and the negative control signal 528 being deactivated (e.g., signal 590 goes high and signal 528 goes low) to disable the sense amplifier 206-2 shown in FIG. 2A. At time t4 the Passd control signal 511 (and Passdb signal) that was activated at time t2 is deactivated. Embodiments are not limited to this example. For instance, in a number of embodiments, the sense amplifier 206-2 shown in FIG. 2A may be enabled subsequent to time t4 (e.g., after he Passd control signal 511 (and Passdb signal) are deactivated).

As shown in FIG. 5D, at time t5, a selected row is enabled (e.g., by row activation signal 504 going high, which drives the capacitor of the selected cell to the voltage corresponding to the logic value stored in the accumulator. At time t6 the selected row is disabled. At time t7 the sense amplifier 206-2 shown in FIG. 2A is disabled (e.g., positive control signal 528 and negative control signal 590 are deactivated in FIG. 5D), and at time t8 equilibration occurs (e.g., signal 526 is activated and the voltages on the complementary data lines 505-1 (D) and 505-2 (D_) are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250-2 of FIG. 2A as described previously and summarized once again in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 (D) and/or 205-2 (D_)).

Figure 6A:
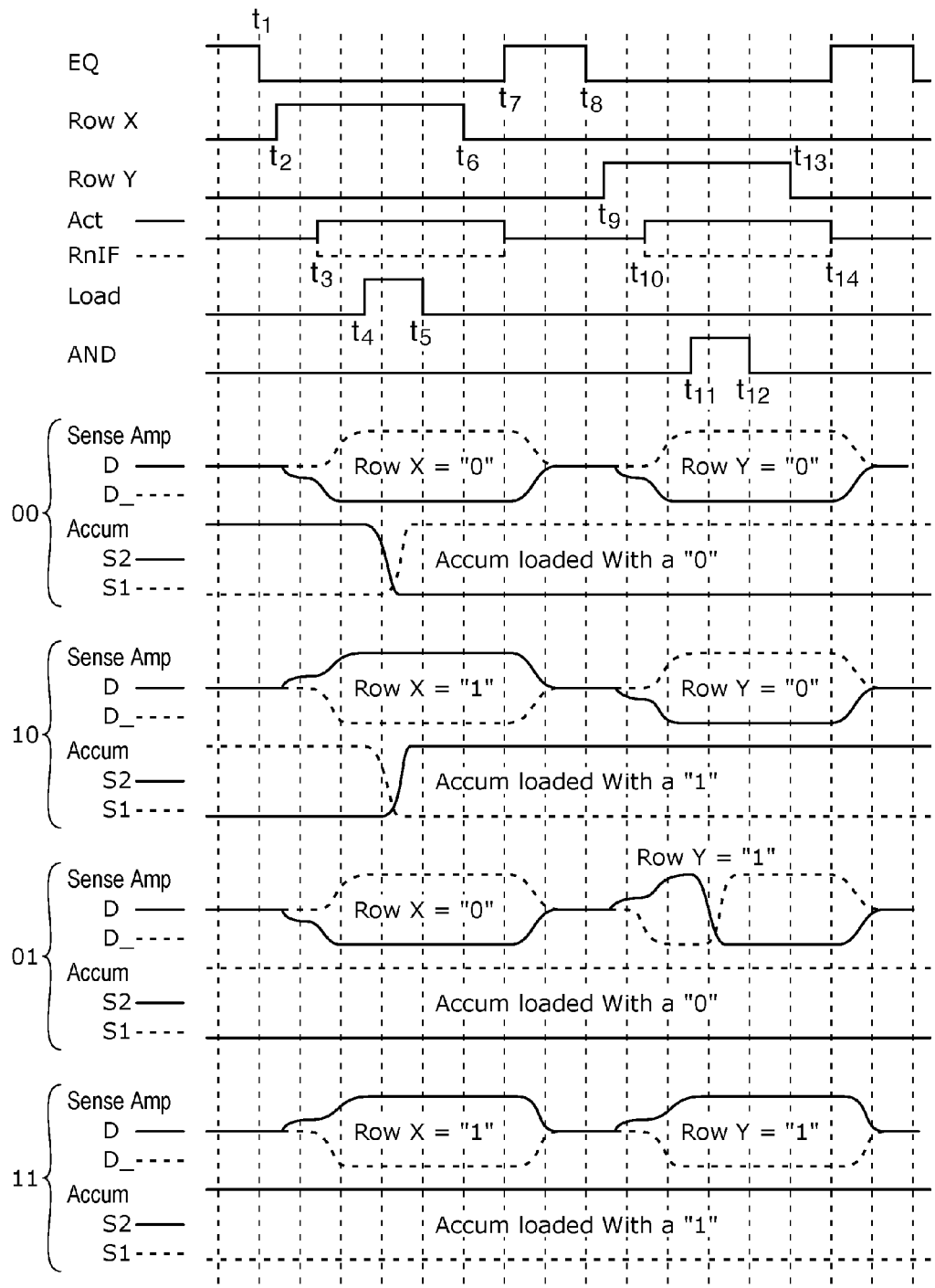
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250-2 in FIG. 2A) to perform the AND logical operation. "EQ" corresponds to an equilibrate signal applied to the sense amp 206-2, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206-2, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D_ corresponding to sense amp 206-2 and on the nodes S1 and S2 corresponding to the compute component 231-2 (e.g., accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:

```
Copy Row X into the Accumulator:
    Deactivate EQ
    Open Row X
    Fire Sense Amps (after which Row X data resides in the
      sense amps)
    Activate LOAD (sense amplifier data (Row X) is
transferred to nodes S1 and S2 of the Accumulator and resides there
dynamically)
    Deactivate LOAD
    Close Row X
    Precharge
```

In the pseudo code above, "Deactivate EQ" indicates that an equilibration signal (EQ signal shown in FIG. 6A) corresponding to the sense amplifier 206-2 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 6A. When the voltage signal applied to ROW X reaches the threshold voltage (Vt) of the access transistor (e.g., 202-4) corresponding to the selected cell, the access transistor turns on and couples the data line (e.g., 205-2 (D_)) to the selected cell (e.g., to capacitor 203-4) which creates a differential voltage signal between the data lines.

After Row X is enabled, in the pseudo code above, "Fire Sense Amps" indicates that the sense amplifier 206-2 is enabled to set the primary latch, as has been described herein, and subsequently disabled. For example, as shown at $t_3$ in FIG. 6A, the ACT positive control signal (e.g., 265 shown in FIG. 2B) goes high and the RnIF negative control signal (e.g., 228 shown in FIG. 2B) goes low, which amplifies the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic is placed on the complementary data line 205-2 (D_). The sensed data value is stored in the primary latch of sense amplifier 206-2. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-4, corresponding to Row X, is coupled to the complementary data line D_, while the memory cell including storage element 203-3, corresponding to Row Y, is coupled to data line D. However, as can be seen in FIG. 2A, the charge stored in memory cell 201-4 (corresponding to Row X) corresponding to a "0" data value causes the voltage on data line D_ (to which memory cell 201-4 is coupled) to go high and the charge stored in memory cell 201-4 corresponding to a "1" data value causes the voltage on data line D_ to go low, which is opposite correspondence between data states and charge stored in memory cell 201-4, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the accumulator of the compute component 231-2. The sensed data value stored in the sense amplifier 206-2 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 6A to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206-2 and the secondary latch of the compute component 231-2 shown in FIG. 2A) and the second data value (stored in a memory cell 201-3 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 201-4 coupled to Row X 204-X) and the second data value (e.g., the data value stored in the memory cell 201-3 coupled to Row Y 204-Y) are summarized below. Example pseudo code associated with "ANDing" the data values can include:

```
Deactivate EQ
Open Row Y
Fire Sense Amps (after which Row Y data resides in the sense amps)
```

-continued

```
Close Row Y
        The result of the logic operation, in the next operation, will
be placed on the sense amp, which will overwrite any row that is active.
                Even when Row Y is closed, the sense amplifier still
contains the Row Y data value.
        Activate AND
                This results in the sense amplifier being written to the value
of the function (e.g., Row X AND Row Y)
                If the accumulator contains a "0" (i.e., a voltage
corresponding to a "0" on node S2 and a voltage corresponding to a
"1" on node S1), the sense amplifier data is written to a "0"
                If the accumulator contains a "1" (i.e., a voltage
corresponding to a "1" on node S2 and a voltage corresponding to a
"0" on node S1), the sense amplifier data remains unchanged
(Row Y data)
                        This operation leaves the data in the accumulator
                        unchanged.
        Deactivate AND
        Precharge
```

In the pseudo code above, "Deactivate EQ" indicates that an equilibration signal corresponding to the sense amplifier 206-2 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-3) corresponding to the selected cell, the access transistor turns on and couples the data line (e.g., D_ 205-2) to the selected cell (e.g., to capacitor 203-3) which creates a differential voltage signal between the data lines.

After Row Y is enabled, in the pseudo code above, "Fire Sense Amps" indicates that the sense amplifier 206-2 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic state is on complementary data line 205-2 (D_). As shown at $t_{10}$ in FIG. 6A, the ACT positive control signal (e.g., 265 shown in FIG. 2B) goes high and the RnIF negative control signal (e.g., 228 shown in FIG. 2B) goes low to fire the sense amps. The sensed data value from memory cell 201-3 is stored in the primary latch of sense amplifier 206-2, as previously described. The secondary latch still corresponds to the data value from memory cell 201-4 since the dynamic latch is unchanged.

After the second data value sensed from the memory cell 201-3 coupled to Row Y is stored in the primary latch of sense amplifier 206-2, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 201-3 from the data line 205-1 (D).

After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231-2 and the second data value (e.g., Row Y) stored in the sense amplifier 206-2, if the dynamic latch of the compute component 231-2 contains a "0" (i.e., a voltage corresponding to a "0" on node S2 and a voltage corresponding to a "1" on node S1), the sense amplifier data is written to a "0" (regardless of the data value previously stored in the sense amp). This is because the voltage corresponding to a "1" on node S1 causes transistor 209-1 to conduct thereby coupling the sense amplifier 206-2 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value. Thus the configuration of the sensing circuitry causes the "0" result to be written and initially stored in the sense amplifier 206-2. This operation leaves the data value in the accumulator unchanged (e.g., from Row X).

If the secondary latch of the accumulator contains a "1" (e.g., from Row X), then the result of the AND operation depends on the data value stored in the sense amplifier 206-2 (e.g., from Row Y). The result of the AND operation should be a "1" if the data value stored in the sense amplifier 206-2 (e.g., from Row Y) is also a "1," but the result of the AND operation should be a "0" if the data value stored in the sense amplifier 206-2 (e.g., from Row Y) is a "0." The sensing circuitry 250-2 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206-2 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206-2, "Deactivate AND" in the pseudo code above indicates that the AND control signal goes low as shown at $t_{12}$ in FIG. 6A, causing pass transistor 207-1 to stop conducting to isolate the sense amplifier 206-2 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal going high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S1 of the secondary latch of the compute component (e.g., 231-2 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
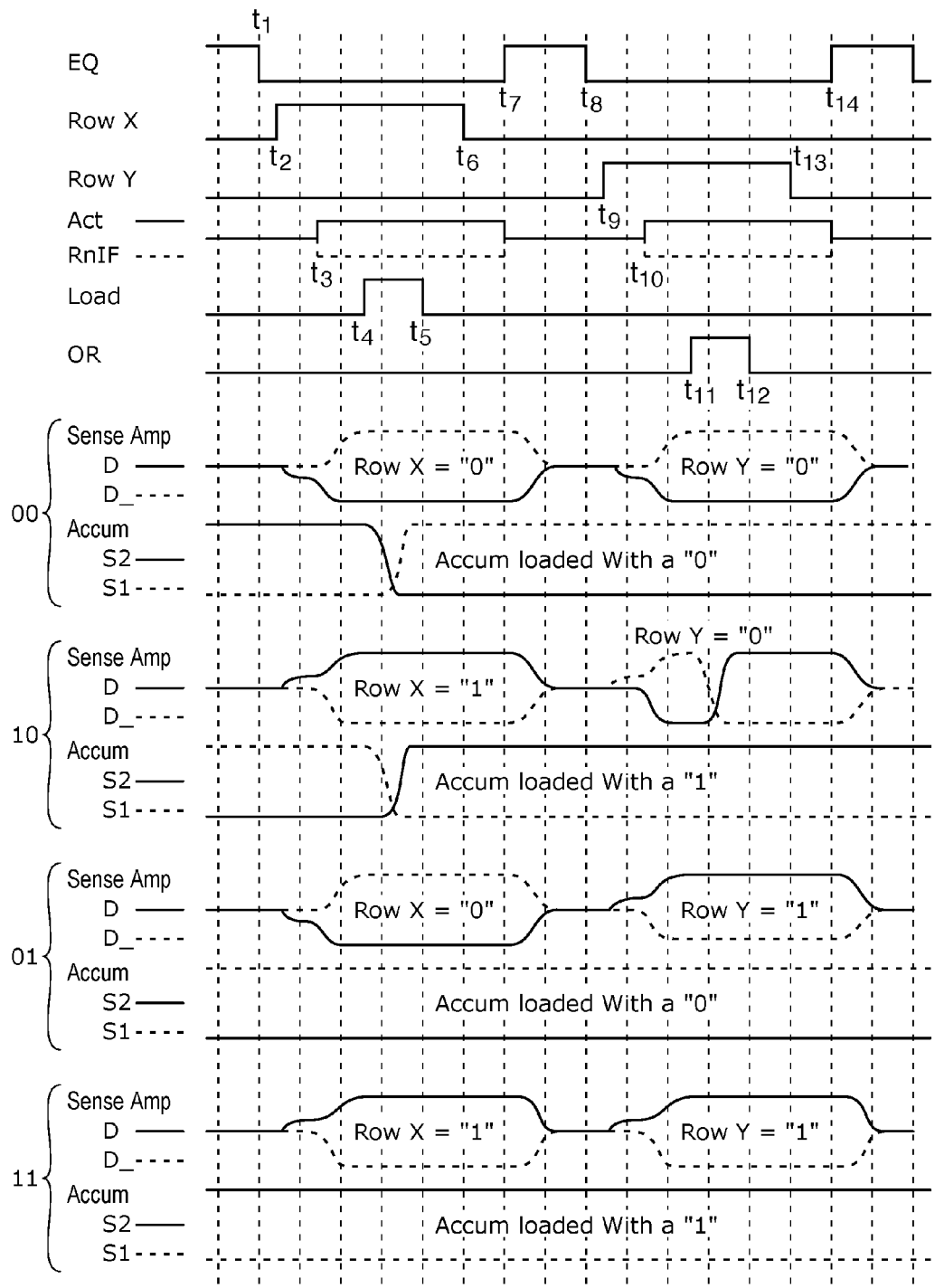

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206-2 and the secondary latch of the compute component 231-2) and the second data value (stored in a memory cell 201-3 coupled to Row Y 204-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

---

Deactivate EQ
Open Row Y
Fire Sense Amps (after which Row Y data resides in the sense amps)
Close Row Y
    When Row Y is closed, the sense amplifier still contains the Row Y data value.
Activate OR
    This results in the sense amplifier being written to the value of the function (e.g., Row X OR Row Y), which may overwrite the data value from Row Y previously stored in the sense amplifier as follows:
        If the accumulator contains a "0" (i.e., a voltage corresponding to a "0" on node S2 and a voltage corresponding to a "1" on node S1), the sense amplifier data remains unchanged (Row Y data)
        If the accumulator contains a "1" (i.e., a voltage corresponding to a "1" on node S2 and a voltage corresponding to a "0" on node S1), the sense amplifier data is written to a "1"
            This operation leaves the data in the accumulator unchanged.
Deactivate OR
Precharge

---

The "Deactivate EQ" (shown at $t_8$ in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231-2 and the second data value (e.g., Row Y) stored in the sense amplifier 206-2, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206-2 (e.g., from Row Y). The result of the OR operation should be a "1" if the data value stored in the sense amplifier 206-2 (e.g., from Row Y) is a "1," but the result of the OR operation should be a "0" if the data value stored in the sense amplifier 206-2 (e.g., from Row Y) is also a "0." The sensing circuitry 250-2 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206-2 is not coupled to ground (either side), and the data value previously stored in the sense amplifier 206-2 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206-2 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206-2 as a result of the OR operation when the secondary latch of the accumulator contains a "1" regardless of the data value previously stored in the sense amp. This operation leaves the data in the accumulator unchanged. FIG. 6B shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S2 of the secondary latch of the compute component 231-2 for an OR logical operation involving each of the possible combination of operands (e.g., Row X/Row Y data values 00, 10, 01, and 11).

After the result of the OR operation is initially stored in the sense amplifier 206-2, "Deactivate OR" in the pseudo code above indicates that the OR control signal goes low as shown at $t_{12}$ in FIG. 6B, causing pass transistor 207-2 to stop conducting to isolate the sense amplifier 206-2 (and data line D 205-2) from ground. If not previously done, Row Y can be closed (as shown at $t_{13}$ in FIG. 6B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250-2 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-2 to conduct and activating the ANDinv control signal causes transistor 214-1 to conduct. In each case, asserting the appropriate inverted control signal can flip the sense amplifier and cause the result initially stored in the sense amplifier 206-2 to be that of the AND operation using the inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206-2. As previously mentioned, activating the ORinv control signal causes transistor 214-2 to conduct and activating the ANDinv control signal causes transistor 214-1 to conduct. The ORinv and/or ANDinv control signals are used in implementing the NOT function, as described in the pseudo code below:

```
Copy Row X into the Accumulator
    Deactivate EQ
    Open Row X
    Fire Sense Amps (after which Row X data resides in the
    sense amps)
    Activate LOAD (sense amplifier data (Row X) is
transferred to nodes S1 and S2 of the Accumulator and resides there
dynamically
    Deactivate LOAD
    Activate ANDinv and ORinv (which puts the compliment
data value on the data lines)
This results in the data value in the sense amplifier being inverted
(e.g., the sense amplifier latch is flipped)
            This operation leaves the data in the accumulator
            unchanged
    Deactivate ANDinv and ORinv
    Close Row X
    Precharge
```

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above for the AND operation and OR operation. However, rather than closing the Row X and Precharging after the Row X data is loaded into the sense amplifier 206-2 and copied into the dynamic latch, a compliment version of the data value in the dynamic latch of the accumulator can be placed on the data line and thus transferred to the sense amplifier 206-2. This is done by enabling (e.g., causing transistor to conduct) and disabling the invert transistors (e.g., ANDinv and ORinv). This results in the sense amplifier 206-2 being flipped from the true data value that was previously stored in the sense amplifier to a compliment data value (e.g., inverted data value) being stored in the sense amp. As such, a true or compliment version of the data value in the accumulator can be transferred to the sense amplifier based upon activating or not activating ANDinv and/or ORinv. This operation leaves the data in the accumulator unchanged.

Because the sensing circuitry 250-2 shown in FIG. 2A initially stores the result of the AND, OR, and/or NOT logical operations in the sense amplifier 206-2 (e.g., on the sense amplifier nodes), these logical operation results can be communicated easily and quickly to any enabled row, any row activated after the logical operation is complete, and/or into the secondary latch of the compute component 231-2. The sense amplifier 206-2 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206-2 fires.

When performing logical operations in this manner, the sense amplifier 206-2 can be pre-seeded with a data value from the dynamic latch of the accumulator to reduce overall current utilized because the sense amps 206-2 are not at full rail voltages (e.g., supply voltage or ground/reference voltage) when accumulator function is copied to the sense amplifier 206-2. An operation sequence with a pre-seeded sense amplifier 206-2 either forces one of the data lines to the reference voltage (leaving the complementary data line at $V_{DD}/2$, or leaves the complementary data lines unchanged. The sense amplifier 206-2 pulls the respective data lines to full rails when the sense amplifier 206-2 fires. Using this sequence of operations will overwrite data in an enabled row.

A SHIFT operation can be accomplished by multiplexing ("muxing") two neighboring data line complementary pairs using a DRAM isolation (ISO) scheme. According to embodiments of the present disclosure, the shift circuitry 223 can be used for shifting data values stored in memory cells coupled by a particular pair of complementary data lines to the sensing circuitry 250-2 (e.g., sense amplifier 206-2) corresponding to a different pair of complementary data lines (e.g., such as a sense amplifier 206-2 corresponding to a left or right adjacent pair of complementary data lines. As used herein, a sense amplifier 206-2 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized by the following pseudo code follows:

```
Deactivate Norm and Activate Shift
Deactivate EQ
Open Row X
Fire Sense Amps (after which shifted Row X data resides in the sense
amps)
Activate Norm and Deactivate Shift
Close Row X
Precharge
```

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206-3 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206-3.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206-3 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge

---

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206-2 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250-2 is stored in the sense amplifier 206-2.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 7:
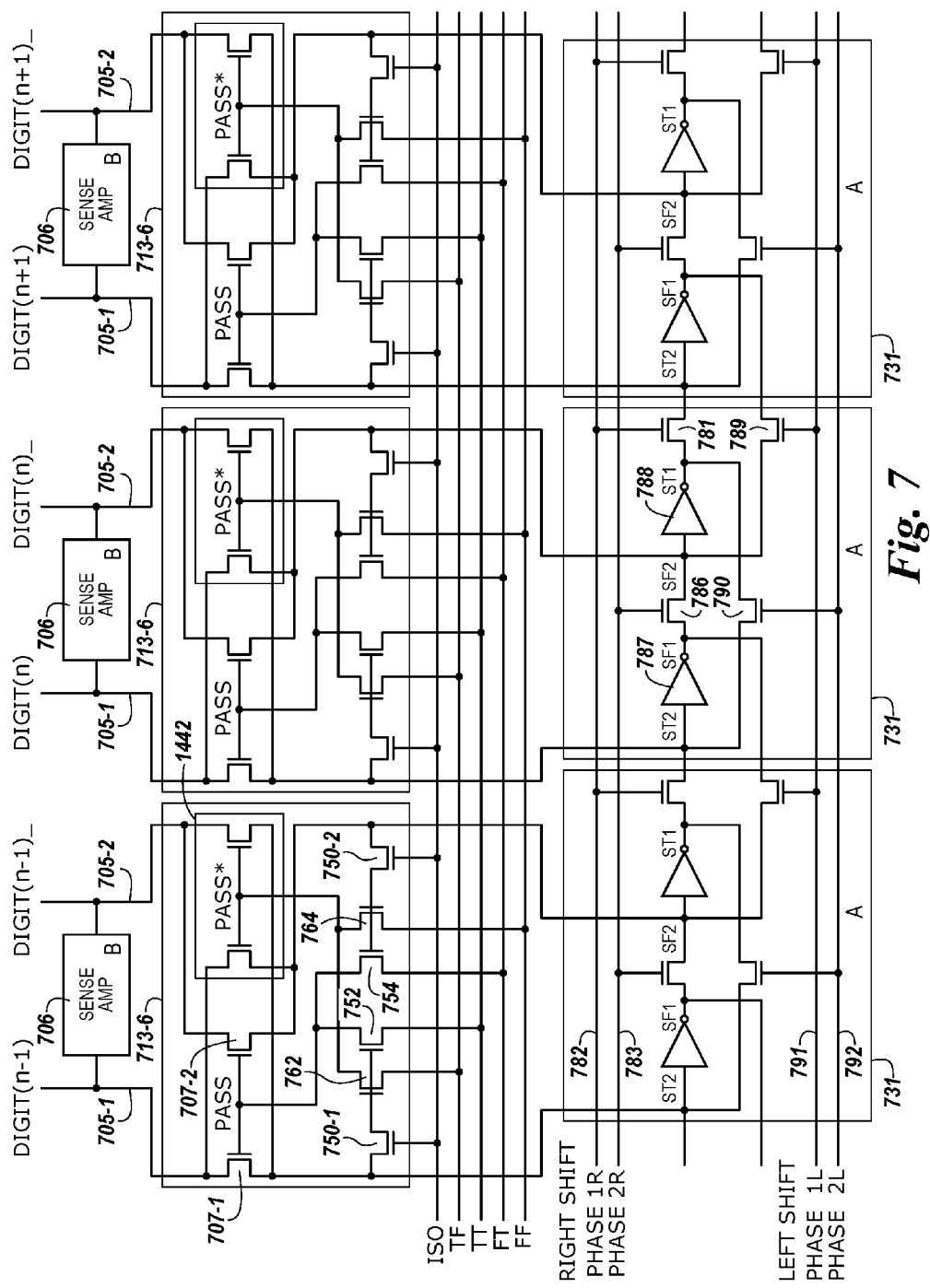
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a number of sense amplifiers 706 coupled to respective pairs of complementary sense lines 705-1 and 705-2, and a corresponding number of compute component 731 coupled to the sense amplifiers 706 via pass gates 707-1 and 707-2 (which can correspond to sense amplifiers 206, sense lines 205-1 and 205-2, compute components 231 coupled to sense amplifiers 206 via pass gates 207-1 and 207-2 in FIG. 2A). The gates of the pass gates 707-1 and 707-2 can be controlled by a logical operation selection logic signal, PASS. For example, an output of the logical operation selection logic 713-6 can be coupled to the gates of the pass gates 707-1 and 707-2.

According to the embodiment illustrated in FIG. 7, the compute components 731 can comprise respective stages (e.g., shift cells) of a loadable shift register configured to shift data values left and right. For example, as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L can be applied to respective control lines 782, 783, 791 and 792 to enable/disable feedback on the latches of the corresponding compute components 731 in association with performing logical operations and/or shifting data in accordance with embodiments described herein. Examples of shifting data (e.g., from a particular compute component 731 to an adjacent compute component 731) is described further below with respect to FIGS. 9 and 10.

Figure 9:
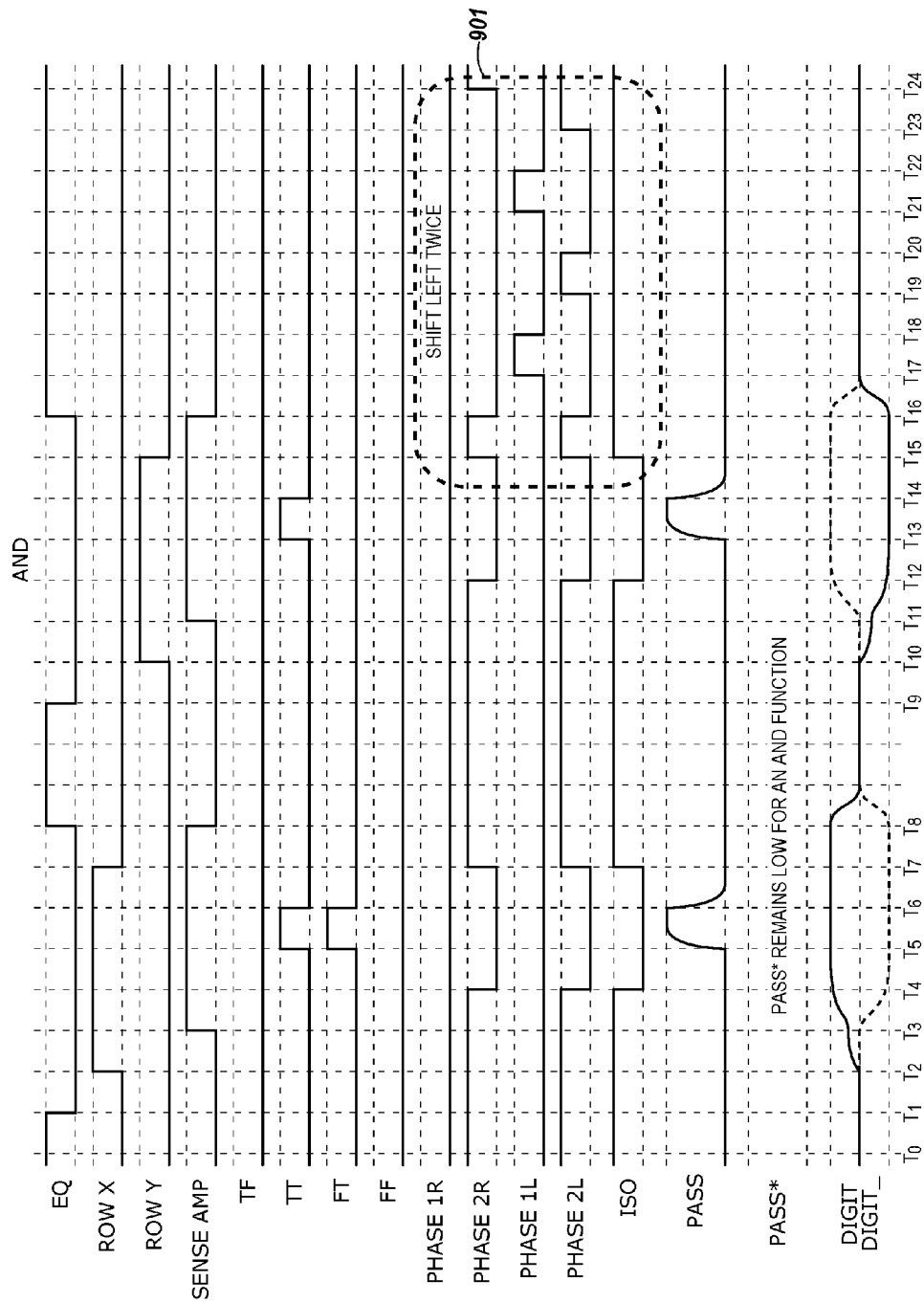
FIG. 9 illustrates a timing diagram associated with performing a logical operation and a shifting operation using the sensing circuitry in accordance with a number of embodiments of the present disclosure.
Figure 10:
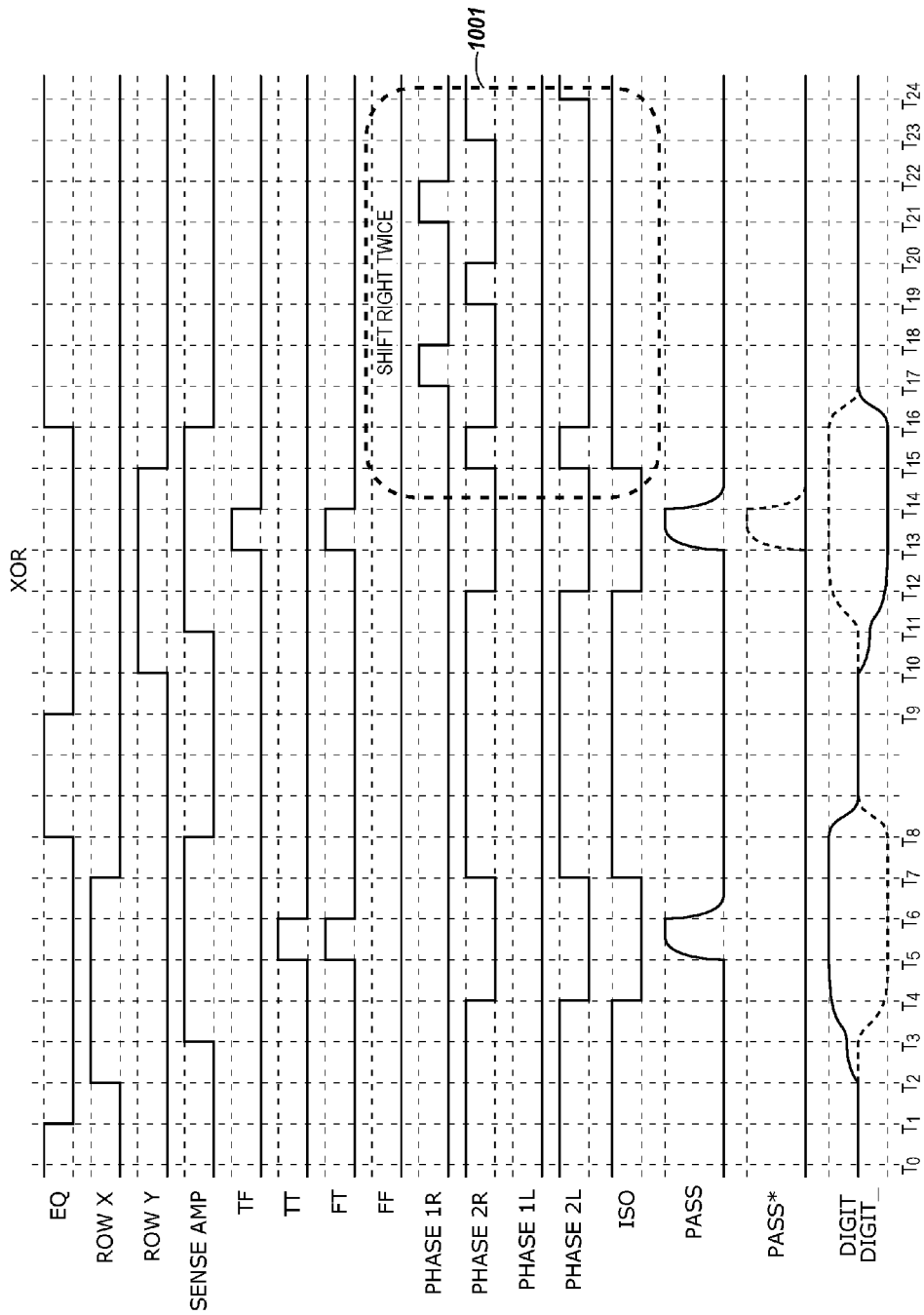
FIG. 10 illustrates a timing diagram associated with performing a logical operation and a shifting operation using the sensing circuitry in accordance with a number of embodiments of the present disclosure.

The logical operation selection logic 713-6 includes the swap gates 742, as well as logic to control the pass gates 707-1 and 707-2 and the swap gates 742. The logical operation selection logic 713-6 includes four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line through isolation transistor 750-1 (having a gate coupled to an ISO signal control line). Gates of logic selection transistors 764 and 754 are coupled to the complementary sense line through isolation transistor 750-2 (also having a gate coupled to an ISO signal control line). FIGS. 9 and 10 illustrate timing diagrams associated with performing logical operations and shifting operations using the sensing circuitry shown in FIG. 7.

FIG. 8 is a logic table illustrating selectable logic operation results implemented by a sensing circuitry (e.g., sensing circuitry 750 shown in FIG. 7) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 706 and compute component 731. The four control signals (e.g., TF, TT, FT, and FF), in conjunction with a particular data value present on the complementary sense lines (e.g., on nodes S and S*), controls the pass gates 707-1 and 707-2 and swap transistors 742, which in turn affects the data value in the compute component 731 and/or sense amplifier 706 before/after firing. The capability to selectably control the swap transistors 742 facilitates implementing logical operations involving inverse data values (e.g., inverse operands and/or inverse result), among others.

Similar to the logic tables illustrated in FIG. 10, Logic Table 8-1 illustrated in FIG. 8 shows the starting data value stored in the compute component 731 shown in column A at 844, and the starting data value stored in the sense amplifier 706 shown in column B at 845. The other 3 column headings in Logic Table 8-1 refer to the state of the pass gates 707-1 and 707-2 and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "NOT OPEN" column 856 corresponds to the pass gates 707-1 and 707-2 and the swap transistors 742 both being in a non-conducting condition, the "OPEN TRUE" column 870 corresponds to the pass gates 707-1 and 707-2 being in a conducting condition, and the "OPEN INVERT" column 871 corresponds to the swap transistors 742 being in a conducting condition. The configuration corresponding to the pass gates 707-1 and 707-2 and the swap transistors 742 both being in a conducting condition is not reflected in Logic Table 8-1 since this results in the sense lines being shorted together.

Via selective control of the pass gates 707-1 and 707-2 and the swap transistors 742, each of the three columns of the upper portion of Logic Table 8-1 can be combined with each of the three columns of the lower portion of Logic Table 8-1 to provide nine (e.g., 3×3) different result combinations, corresponding to nine different logical operations, as indicated by the various connecting paths shown at 875. The nine different selectable logical operations that can be implemented by the sensing circuitry 750 are summarized in Logic Table 8-2.

The columns of Logic Table 8-2 show a heading 880 that includes the states of logic selection control signals (e.g., FF, FT, TF, TT). For example, the state of a first logic selection control signal (e.g., FF) is provided in row 876, the state of a second logic selection control signal (e.g., FT) is provided in row 877, the state of a third logic selection control signal (e.g., TF) is provided in row 878, and the state of a fourth logic selection control signal (e.g., TT) is provided in row 879. The particular logical operation corresponding to the results is summarized in row 847.

FIG. 9 illustrates a timing diagram associated with performing a logical AND operation and a shifting operation using the sensing circuitry in accordance with a number of embodiments of the present disclosure. FIG. 9 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 706). The TF, TT, FT, and FF signals correspond to logic selection control signals such as those shown in FIG. 7 (e.g., signals coupled to logic selection transistors 762, 752, 754, and 764). The PHASE 1R, PHASE 2R, PHASE 1L, and PHASE 2L signals correspond to the control signals (e.g., clock signals) provided to respective control lines 782, 783, 791 and 792 shown in FIG. 7. The ISO signal corresponds to the signal coupled to the gates of the isolation transistors 750-1 and 750-2 shown in FIG. 7. The PASS signal corresponds to the signal coupled to the gates of pass transistors 707-1 and 707-2 shown in FIG. 7, and the PASS* signal corresponds to the signal coupled to the gates of the swap transistors 742. The DIGIT and DIGIT_ signals correspond to the signals present on the respective sense lines 705-1 (e.g., DIGIT (n)) and 705-2 (e.g., DIGIT (n)_).

The timing diagram shown in FIG. 9 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 9, reference will be made to the sensing circuitry described in FIG. 7. For example, the logical operation described in FIG. 9 can include storing the data value of the ROW X memory cell (e.g., the "ROW X data value) in the latch of the corresponding compute component 731 (e.g., the "A" data value), which can be referred to as the accumulator 731, storing the data value of the ROW Y memory cell (e.g., the "ROW Y data value") in the latch of the corresponding sense amplifier 706 (e.g., the "B" data value), and performing a selected logical operation (e.g., a logical AND operation in this example) on the ROW X data value and the ROW Y data value, with the result of the selected logical operation being stored in the latch of the compute component 731.

As shown in FIG. 9, at time $T_1$, equilibration of the sense amplifier 706 is disabled (e.g., EQ goes low). At time $T_2$, ROW X goes high to access (e.g., select) the ROW X memory cell. At time $T_3$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW X data value (e.g., as shown by the DIGIT and DIGIT_ signals), and the ROW X data value is latched in the sense amplifier 706. At time $T_4$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time T$_4$, ISO goes low, which disables isolation transistors 750-1 and 750-2. At time T$_5$, TT and FT are enabled (e.g., go high), which results in PASS going high (e.g., since either transistor 752 or 754 will conduct depending on which of node ST2 or node SF2 was high when ISO was disabled at time T$_4$ (recall that when ISO is disabled, the voltages of the nodes ST2 and SF2 reside dynamically on the gates of the respective enable transistors 752 and 754). PASS going high enables the pass transistors 707-1 and 707-2 such that the DIGIT and DIGIT signals, which correspond to the ROW X data value, are provided to the respective compute component nodes ST2 and SF2. At time T$_6$, TT and FT are disabled, which results in PASS going low, which disables the pass transistors 707-1 and 707-2. It is noted that PASS* remains low between time T$_5$ and T$_6$ since the TF and FF signals remain low. At time T$_7$, ROW X is disabled, and PHASE 2R, PHASE 2L, and ISO are enabled. Enabling PHASE 2R and PHASE 2L at time T$_7$ enables feedback on the latch of the compute component 731 such that the ROW X data value is latched therein. Enabling ISO at time T$_7$ again couples nodes ST2 and SF2 to the gates of the enable transistors 752, 754, 762, and 764. At time T$_8$, equilibration is enabled (e.g., EQ goes high such that DIGIT and DIGIT_ are driven to an equilibrate voltage such as V$_{DD}$/2) and the sense amplifier 706 is disabled (e.g., SENSE AMP goes low).

With the ROW X data value latched in the compute component 731, equilibration is disabled (e.g., EQ goes low at time T$_9$). At time T$_{10}$, ROW Y goes high to access (e.g., select) the ROW Y memory cell. At time T$_{11}$, the sense amplifier 706 is enabled (e.g., SENSE AMP goes high), which drives the complementary sense lines 705-1 and 705-2 to the appropriate rail voltages (e.g., V$_{DD}$ and GND) responsive to the ROW Y data value (e.g., as shown by the DIGIT and DIGIT_ signals), and the ROW Y data value is latched in the sense amplifier 706. At time T$_{12}$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time T$_{12}$, ISO goes low, which disables isolation transistors 750-1 and 750-2. Since the desired logical operation in this example is an AND operation, at time T$_{13}$, TT is enabled while TF, FT and FF remain disabled (as shown in TABLE 8-2, FF=0, FT=0, TF=0, and TT=1 corresponds to a logical AND operation). Whether enabling TT results in PASS going high depends on the value stored in the compute component 731 when ISO is disabled at time T$_{12}$. For example, enable transistor 752 will conduct if node ST2 was high when ISO is disabled, and enable transistor will not conduct if node ST2 was low when ISO was disabled at time T$_{12}$.

In this example, if PASS goes high at time T$_{13}$, the pass transistors 707-1 and 707-2 are enabled such that the DIGIT and DIGIT_ signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time T$_{13}$, the pass transistors 707-1 and 707-2 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same.

At time T$_{14}$, TT is disabled, which results in PASS going (or remaining) low, such that the pass transistors 707-1 and 707-2 are disabled. It is noted that PASS* remains low between time T$_{13}$ and T$_{14}$ since the TF and FF signals remain low. At time T$_{15}$, ROW Y is disabled, and PHASE 2R, PHASE 2L, and ISO are enabled. Enabling PHASE 2R and PHASE 2L at time T$_{15}$ enables feedback on the latch of the compute component 731 such that the result of the AND operation (e.g., "A" AND "B") is latched therein. Enabling ISO at time T$_{15}$ again couples nodes ST2 and SF2 to the gates of the enable transistors 752, 754, 762, and 764. At time T$_{16}$, equilibration is enabled (e.g., EQ goes high such that DIGIT and DIGIT_ are driven to an equilibrate voltage) and the sense amplifier 706 is disabled (e.g., SENSE AMP goes low).

The result of the AND operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 901) signaling associated with shifting data (e.g., from a compute component 731 to an adjacent compute component 731). The example shown in FIG. 9 illustrates two left shifts such that a data value stored in a compute component corresponding to column "N" is shifted left to a compute component corresponding to column "N−2". As shown at time T$_{16}$, PHASE 2R and PHASE 2L are disabled, which disables feedback on the compute component latches, as described above. To perform a first left shift, PHASE 1L is enabled at time T$_{17}$ and disabled at time T$_{18}$. Enabling PHASE 1L causes transistor 789 to conduct, which causes the data value at node SF1 to move left to node SF2 of a left-adjacent compute component 731. PHASE 2L is subsequently enabled at time T$_{19}$ and disabled at time T$_{20}$. Enabling PHASE 2L causes transistor 790 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time T$_{21}$ and disabling PHASE 1L at time T$_{22}$. PHASE 2L is subsequently enabled at time T$_{23}$ to complete the second left shift. Subsequent to the second left shift, PHASE 2L remains enabled and PHASE 2R is enabled (e.g., at time T$_{24}$) such that feedback is enabled to latch the data values in the compute component latches.

FIG. 10 illustrates a timing diagram associated with performing a logical XOR operation and a shifting operation using the sensing circuitry in accordance with a number of embodiments of the present disclosure. FIG. 10 includes the same waveforms described in FIG. 9 above. However, the timing diagram shown in FIG. 10 is associated with performing a logical XOR operation on a ROW X data value and a ROW Y data value (e.g., as opposed to a logical AND operation). Reference will again be made to the sensing circuitry described in FIG. 7.

The signaling indicated at times T$_0$ through T$_9$ for FIG. 10 are the same as for FIG. 9 and will not be repeated here. As such, at time T9, EQ is disabled with the ROW X data value being latched in the compute component 731. At time T$_{10}$, ROW Y goes high to access (e.g., select) the ROW Y memory cell. At time T$_{11}$, the sense amplifier 706 is enabled (e.g., SENSE AMP goes high), which drives the complementary sense lines 705-1 and 705-2 to the appropriate rail voltages (e.g., V$_{DD}$ and GND) responsive to the ROW Y data value (e.g., as shown by the DIGIT and DIGIT_ signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component 731 may be overwritten during the logical operation. Also, at time $T_{12}$, ISO goes low, which disables isolation transistors 750-1 and 750-2. Since the desired logical operation in this example is an XOR operation, at time $T_{13}$, TF and FT are enabled while TT and FF remain disabled (as shown in TABLE 8-2, FF=0, FT=1, TF=1, and TT=0 corresponds to a logical XOR (e.g., "AXB") operation). Whether enabling TF and FT results in PASS or PASS* going high depends on the value stored in the compute component 731 when ISO is disabled at time $T_{12}$. For example, enable transistor 762 will conduct if node ST2 was high when ISO is disabled, and enable transistor 762 will not conduct if node ST2 was low when ISO was disabled at time $T_{12}$. Similarly, enable transistor 754 will conduct if node SF2 was high when ISO is disabled, and enable transistor 754 will not conduct if node SF2 was low when ISO is disabled.

In this example, if PASS goes high at time $T_{13}$, the pass transistors 707-1 and 707-2 are enabled such that the DIGIT and DIGIT_ signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time $T_{13}$, the pass transistors 707-1 and 707-2 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same. In this example, if PASS* goes high at time $T_{13}$, the swap transistors 742 are enabled such that the DIGIT and DIGIT_ signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 731 (e.g., the ROW X data value) may be flipped, depending on the value of DIGIT and DIGIT_ (e.g., the ROW Y data value). In this example, if PASS* stays low at time $T_{13}$, the swap transistors 742 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same.

At time $T_{14}$, TF and FT are disabled, which results in PASS and PASS* going (or remaining) low, such that the pass transistors 707-1 and 707-2 and swap transistors 742 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the XOR operation (e.g., "A" XOR "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT_ are driven to an equilibrate voltage) and the sense amplifier 706 is disabled (e.g., SENSE AMP goes low).

The result of the XOR operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 10 also includes (e.g., at 1001) signaling associated with shifting data (e.g., from a compute component 731 to an adjacent compute component 731). The example shown in FIG. 10 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 781 to conduct, which causes the data value at node ST1 to move right to node ST2 of a right-adjacent compute component 731. PHASE 2R is subsequently enabled at time $T_{19}$ and disabled at time $T_{20}$. Enabling PHASE 2R causes transistor 786 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 9 and 10 include the logical operation result being stored in the compute component (e.g., 731), sensing circuitry in accordance with embodiments described herein can be operated to perform logical operations with the result being initially stored in the sense amplifier (e.g., as illustrated in FIG. 8). Also, embodiments are not limited to the "AND" and "XOR" logical operation examples described in FIGS. 9 and 10, respectively. For example, sensing circuitry in accordance with embodiments of the present disclosure (e.g., 750 shown in FIG. 7) can be controlled to perform various other logical operations such as those shown in Table 8-2.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs in parallel, e.g., concurrently, using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving an off pitch processing unit discrete from the memory such that data must be transferred there between. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

What is claimed is:

1. An apparatus, comprising:
   a host; and
   a memory device, comprising:
      a first group of memory cells coupled to a first access line and a number of sense lines of a memory array;
      a second group of memory cells coupled to a second access line and the number of sense lines of the memory array; and
      a controller, in response to receiving an instruction from the host, configured to use sensing circuitry to shift a first element stored in the first group of memory cells by a number of bits positions defined by a second element stored in the second group of memory cells;
   wherein the host is configured to provide the instruction to the memory device to request data of the first element that is shifted by the number of bit positions.

2. The apparatus of claim 1, wherein the controller is configured to perform the shift without transferring data via an input/output (I/O) line.

3. The apparatus of claim 1, wherein the controller is further configured to provide data of the first element that has been shifted by the number of bit positions to the host.

4. The method of claim 3, wherein the result of the shift is stored in at least one of the first group of memory cells and the second group of memory cells prior to providing the data of the shifted first element to the host.

5. The apparatus of claim 1, wherein the controller is configured to performing the shift by performing a number of AND operations, OR operations, SHIFT operations, and INVERT operations without a sense line address access.

6. The method of claim 1, wherein the number of operations are performed using sensing circuitry coupled to each of a number of columns of complementary sense lines.

7. An apparatus, comprising:
   a host;
   a first group of memory cells coupled to a first access line and configured to store a first number of bits that represent a first element;
   a second group of memory cells coupled to the first access line and configured to store a second number of bits that represent a second element;
   a third group of memory cells coupled to a second access line and configured to store a third element;
   a fourth group of memory cells coupled to the second access line and configured to store a fourth element;
   a controller configured to operate sensing circuitry, in response to receiving an instruction from the host, to:
      shift the first number of bits within the first group of memory cells by a first number of bit positions defined by the third element; and
      shift the second number of bits within the second group of memory cells by a second number of bit positions defined by the fourth element by performing a number of operations without transferring data via an input/output (I/O) line; and
   wherein the host is configured to provide an instruction to the controller to instruct the controller to shift the first element by the first number of bit positions and the second element by the second number of bit positions.

8. The apparatus of claim 7, wherein the host configured to provide the instruction comprises the host configured to provide a first instruction that instructs the controller to shift the first element by the first number of bit positions.

9. The apparatus of claim 8, wherein the host configured to provide the instruction comprises the host configured to provide a second instruction that instructs the controller to shift the second element by the second number of bit positions.

10. The apparatus of claim 9, wherein the controller is configured to shift the first element in response to receiving the first instruction and to shift the second element in response to receiving the second instruction.

11. The apparatus of claim 7, wherein each of the sensing circuitry comprises a sense amplifier and a compute component.

12. The apparatus of claim 11, wherein the sense amplifier comprises a primary latch and the compute component comprises a secondary latch.

13. The apparatus of claim 7, wherein the controller is configured to operate the sensing circuitry to shift the first number of bits within the first number of memory cells and the second number of bits within the second number of memory cells in parallel.

14. The apparatus of claim 7, wherein:
   the first number of bits are shifted within the first number of memory cells when the third element has a first decimal value of one or higher; and
   the second number of bits are shifted within the second number of memory cells when the fourth element has a second decimal value of one or higher.

15. A method for performing a number of shift operations, comprising:
   providing, by a host, an instruction to a controller of a memory device to perform a shift operation;
   performing, by the controller and in response to receiving the instruction, the shift operation on a first bit-vector comprising a first number of elements stored in a first group of memory cells coupled to a first access line and a number of sense lines of a memory array, wherein the shift operation includes shifting the first bit-vector by a number of bit positions defined by a second bit-vector without a sense line address access;
   wherein the second bit-vector is stored in a second group of memory cells coupled to a second access line and the number of sense lines of the memory array; and
   providing a result of the shift operation to the host.

16. The method of claim 15, wherein performing the shift operation comprises performing a number of iterations of operations using:
   a SHIFT MASK bit-vector;
   a TMPSHIFTED MASK bit-vector;
   an ELEMENT MASK bit-vector; and
   an EFFECTIVE MASK bit-vector;
   wherein each iteration of operations comprises determining whether any of the first elements comprising the first bit-vector remains to have associated bits shifted within the first group of memory cells.

17. The method of claim 15, wherein the quantity of the number of iterations of operations is equal to $\log_2$(element width) wherein an element width is a quantity of bits that represent each of the first elements.

18. The method of claim 16, wherein performing the shift operation further comprises:
   creating the ELEMENT MASK bit-vector; and
   creating the EFFECTIVE MASK bit-vector.

19. The method of claim 18, wherein creating the ELEMENT MASK bit-vector comprises:
   store a 1-bit as a least significant bit (LSB) of each of the number of elements stored in the first bit-vector in the first number of memory cells; and
   store a 0-bit in a remainder of the first number of memory cells.

20. The method of claim 18, wherein creating the ELEMENT MASK bit-vector comprises:
   store a 1-bit as a most significant bit (MSB) of each of the number of elements stored in the first bit-vector in the first number of memory cells; and
   store a 0-bit in a remainder of the first number of memory cells.

* * * * *